(12) United States Patent
Choi et al.

(10) Patent No.: US 11,888,086 B2
(45) Date of Patent: Jan. 30, 2024

(54) APPARATUS AND METHOD FOR MANUFACTURING DISPLAY DEVICE

(71) Applicant: Samsung Display Co., LTD., Yongin-si (KR)

(72) Inventors: Jin Woo Choi, Yongin-si (KR); Min Woo Kim, Yongin-si (KR); Sung Kook Park, Yongin-si (KR); Dae Ho Song, Yongin-si (KR); So Yeon Yoon, Yongin-si (KR); Joo Woan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 210 days.

(21) Appl. No.: 17/553,653

(22) Filed: Dec. 16, 2021

(65) Prior Publication Data
US 2022/0352411 A1    Nov. 3, 2022

(30) Foreign Application Priority Data

Apr. 30, 2021    (KR) .......................... 10-2021-0056925

(51) Int. Cl.
*H01L 33/00* (2010.01)
*H01L 25/075* (2006.01)

(52) U.S. Cl.
CPC ...... *H01L 33/0095* (2013.01); *H01L 25/0753* (2013.01); *H01L 33/0093* (2020.05); *H01L 2933/0016* (2013.01)

(58) Field of Classification Search
None
See application file for complete search history.

(56) References Cited

U.S. PATENT DOCUMENTS

| 10,192,858 B2 | 1/2019 | Higginson et al. | |
| 2019/0067059 A1* | 2/2019 | Ha | H01L 22/12 |
| 2020/0090934 A1* | 3/2020 | Kitahara | H01L 21/6836 |

FOREIGN PATENT DOCUMENTS

| JP | 4841944 B2 | 12/2011 |
| KR | 10-2050866 B1 | 12/2019 |
| KR | 10-2020-0020208 A | 2/2020 |
| WO | WO 2020/080603 A1 | 4/2020 |

* cited by examiner

*Primary Examiner* — Bradley Smith
(74) *Attorney, Agent, or Firm* — Lewis Roca Rothgerber Christie LLP

(57) ABSTRACT

A manufacturing apparatus of a display device, includes: a first unit to transfer a plurality of light emitting elements on a growth substrate to a first film; a second unit to expand the first film; a third unit to retransfer the plurality of light emitting elements to a second film; a fourth unit to determine positions of the plurality of light emitting elements on the second film; a fifth unit to bin the light emitting elements on the second film, and determine an effective light source from among the light emitting elements; a sixth unit to form a plurality of pixels on a substrate, each pixel including a first bonding electrode; a seventh unit to remove the second film after transferring one light emitting element to the first bonding electrode of one pixel; and an eighth unit to form a second electrode on the one light emitting element.

20 Claims, 33 Drawing Sheets

170: 170a, 170b

APPARATUS AND METHOD FOR MANUFACTURING DISPLAY DEVICE

CROSS-REFERENCE TO RELATED APPLICATION

This application claims priority to and the benefit of Korean Patent Application No. 10-2021-0056925, filed in the Korean Intellectual Property Office on Apr. 30, 2021, the entire content of which is incorporated herein by reference.

BACKGROUND

1. Field

Aspects of embodiments of the present disclosure relate to an apparatus, and a method for manufacturing a display device.

2. Description of the Related Art

Recently, as interest in an information display has been increasing, research and development for display devices are continuously being conducted.

SUMMARY

One or more embodiments of the present disclosure are directed to an apparatus and a method for manufacturing a display device in which one light emitting element may be individually transferred to one pixel at a time.

According to one or more embodiments of the present disclosure, a manufacturing apparatus of a display device, includes: a first unit configured to transfer a plurality of light emitting elements on a growth substrate to a first film to be spaced from one another by a first distance; a second unit configured to expand the first film to space each of the plurality of light emitting elements on the first film from adjacent light emitting elements by a second distance greater than the first distance; a third unit configured to retransfer the plurality of light emitting elements to a second film; a fourth unit configured to determine positions of the plurality of light emitting elements by irradiating a guide laser beam to the plurality of light emitting elements on the second film; a fifth unit configured to bin the light emitting elements on the second film, and determine an effective light source from among the light emitting elements; a sixth unit configured to form a plurality of pixels on a substrate, each pixel including one or more transistors, a first electrode electrically connected to a transistor from among the one or more transistors, and a first bonding electrode on the first electrode; a seventh unit configured to remove the second film after transferring one light emitting element to the first bonding electrode of one pixel by irradiating a laser beam using a laser shot; and an eighth unit configured to form a second electrode on the one light emitting element.

In an embodiment, each of the plurality of light emitting elements may include a first end portion and a second end portion in a length direction, the first end portion may be configured to contact the first bonding electrode on the first electrode to be electrically connected to the first electrode, and the second end portion may be configured to contact the second electrode to be electrically connected to the second electrode.

In an embodiment, each of the plurality of light emitting elements may include: a second bonding electrode located at the first end portion, and configured to contact the first bonding electrode to be electrically connected to the first bonding electrode; an auxiliary layer located at the second end portion, and configured to contact the second electrode to be electrically connected to the second electrode; a second semiconductor layer located on the second bonding electrode; a first semiconductor layer located between the auxiliary layer and the second semiconductor layer; and an active layer located between the first semiconductor layer and the second semiconductor layer. The first semiconductor layer may be an N-type semiconductor layer doped with an N-type dopant, and the second semiconductor layer may be a P-type semiconductor layer doped with a P-type dopant.

In an embodiment, the first end portion of each of the light emitting elements may contact the first film in the first unit; and the first unit may be configured to separate the second end portion of each of the light emitting elements from the growth substrate to be exposed.

In an embodiment, the second distance may be 10 μm or more, and may be larger than a size of the laser shot.

In an embodiment, the first film may include an expandable material, and may include a first bonding layer, and a first base substrate on the first bonding layer; the first bonding layer may contact the second end portion of each of the light emitting elements, and may include a material having an adhesiveness; and the first base substrate may support the light emitting elements contacting the first bonding layer, and may include at least one of polyolefine, polyvinyl chloride (PVC), elastomeric silicone, elastomeric polyurethane, or elastomeric polyisoprene.

In an embodiment, the first film may be expanded so that a density of the plurality of light emitting elements corresponds to that of the first bonding electrodes of the pixels.

In an embodiment, the fourth unit may include an image sensor, and the fourth unit may be configured to determine the positions of the light emitting elements depending on whether the guide laser beam irradiated to the light emitting elements and the second film flows to the image sensor.

In an embodiment, each of the light emitting elements may further include a reflective electrode between the second semiconductor layer and the second bonding electrode; and the reflective electrode may be configured to reflect the guide laser beam irradiated to the light emitting elements to prevent the guide laser beam from passing through the second film on which the light emitting elements are located.

In an embodiment, the first unit may be configured to separate the growth substrate from the plurality of light emitting elements using a laser lift-off method or chemical lift-off method to expose the second end portion of each of the light emitting elements.

In an embodiment, the second film may be located at an upper portion of the exposed second end portion of each of the light emitting elements in the third unit; and the third unit may be configured to retransfer the light emitting elements to the second film so that the second end portion of each of the light emitting elements contacts the second film.

In an embodiment, the seventh unit may be configured to bond the first bonding electrode of the one pixel and the second bonding electrode of the one light emitting element to each other.

In an embodiment, the second end portion of the one light emitting element may be exposed in the eighth unit; and the eighth unit may be configured to form a bank covering a portion of the one light emitting element, and form the second electrode on the bank.

In an embodiment, the seventh unit may be configured to transfer the one light emitting element to the first bonding electrode of the one pixel by one laser shot.

In an embodiment, the growth substrate may include: a first growth substrate on which one or more first light emitting elements are grown, the first light emitting elements being configured to emit red light; a second growth substrate on which one or more second light emitting elements are grown, the second light emitting elements being configured to emit green light; and a third growth substrate on which one or more third light emitting elements are grown, the third light emitting elements being configured to emit blue light.

In an embodiment, a first light emitting element from among the one or more first light emitting elements may be transferred to the first bonding electrode of a first pixel from among the plurality of pixels through the first to seventh units; a second light emitting element from among the one or more second light emitting elements may be transferred to the first bonding electrode of a second pixel from among the plurality of pixels through the first to seventh units; and a third light emitting element from among the one or more third light emitting elements may be transferred to the first bonding electrode of a third pixel from among the plurality of pixels through the first to seventh units.

In an embodiment, each of the plurality of pixels may include an emission area in which one light emitting element is to be located, and a non-emission area adjacent to the emission area; the eighth unit may be configured to form an upper substrate on the second electrode of each of the pixels; and the upper substrate may include: a light conversion pattern layer located at an upper portion of the second electrode to correspond to the emission area of a corresponding pixel from among the plurality of pixels; and a light blocking pattern located at an upper portion of the second electrode to correspond to the non-emission area of the corresponding pixel from among the plurality of pixels.

According to one or more embodiments of the present disclosure, a manufacturing method of a display device, includes: transferring a plurality of light emitting elements grown on a growth substrate onto a first film to be spaced from one another by a first distance; expanding the first film by using an expanding device to space each of the plurality of light emitting elements on the first film from adjacent light emitting elements by a second distance larger than the first distance; retransferring the light emitting elements that are spaced from one another by the second distance on the first film to a second film; determining positions of the light emitting elements on the second film by irradiating a guide laser beam; removing an ineffective light source from among the light emitting elements on the second film, and binning the light emitting elements; forming a plurality of pixels on a substrate, each of the pixels including one or more of transistors, a first electrode electrically connected to a transistor from among the one or more transistors, and a bonding electrode on the first electrode; transferring each of the light emitting elements on the second film to a corresponding bonding electrode of a corresponding pixel from among the plurality of pixels by irradiating a laser beam by using a laser shot; bonding each of the transferred light emitting elements to the corresponding bonding electrode of the corresponding pixel; and forming a second electrode on each of the transferred light emitting elements.

In an embodiment, the second distance may be 10 μm or more, and may be larger than a size of the laser shot.

In an embodiment, the first film may be expanded so that a density of the plurality of light emitting elements corresponds to that of the bonding electrodes of the plurality of pixels.

According to one or more embodiments of the present disclosure, by transferring light emitting elements to a first film, expanding the first film, and then securing a sufficient distance between adjacent light emitting elements to transfer only one light emitting element onto a bonding electrode of each pixel with a single laser shot one at a time, it may be possible to provide an apparatus and method for manufacturing a display device in which the number of light emitting elements that may be lost during the transfer process may be reduced.

In addition, according to one or more embodiments of the present disclosure, an apparatus and method for manufacturing a display device in which a process defective rate is reduced by transferring one light emitting element onto a bonding electrode of one pixel at a time may be provided.

Further, according to one or more embodiments of the present disclosure, by retransferring light emitting elements on a first film to a second film, and then irradiating a guide laser to determine positions of the light emitting elements, an apparatus and method for manufacturing a display device may be provided in which a position of a laser shot used when transferring each light emitting element onto a bonding electrode may be easily controlled.

However, the aspects and features of the present disclosure are not limited to those described above, and other aspects and features may be included in the present specification.

BRIEF DESCRIPTION OF THE DRAWINGS

The above and other aspects and features of the present disclosure will be more clearly understood from the following detailed description of the illustrative, non-limiting example embodiments with reference to the accompanying drawings.

DETAILED DESCRIPTION

Figure 1:
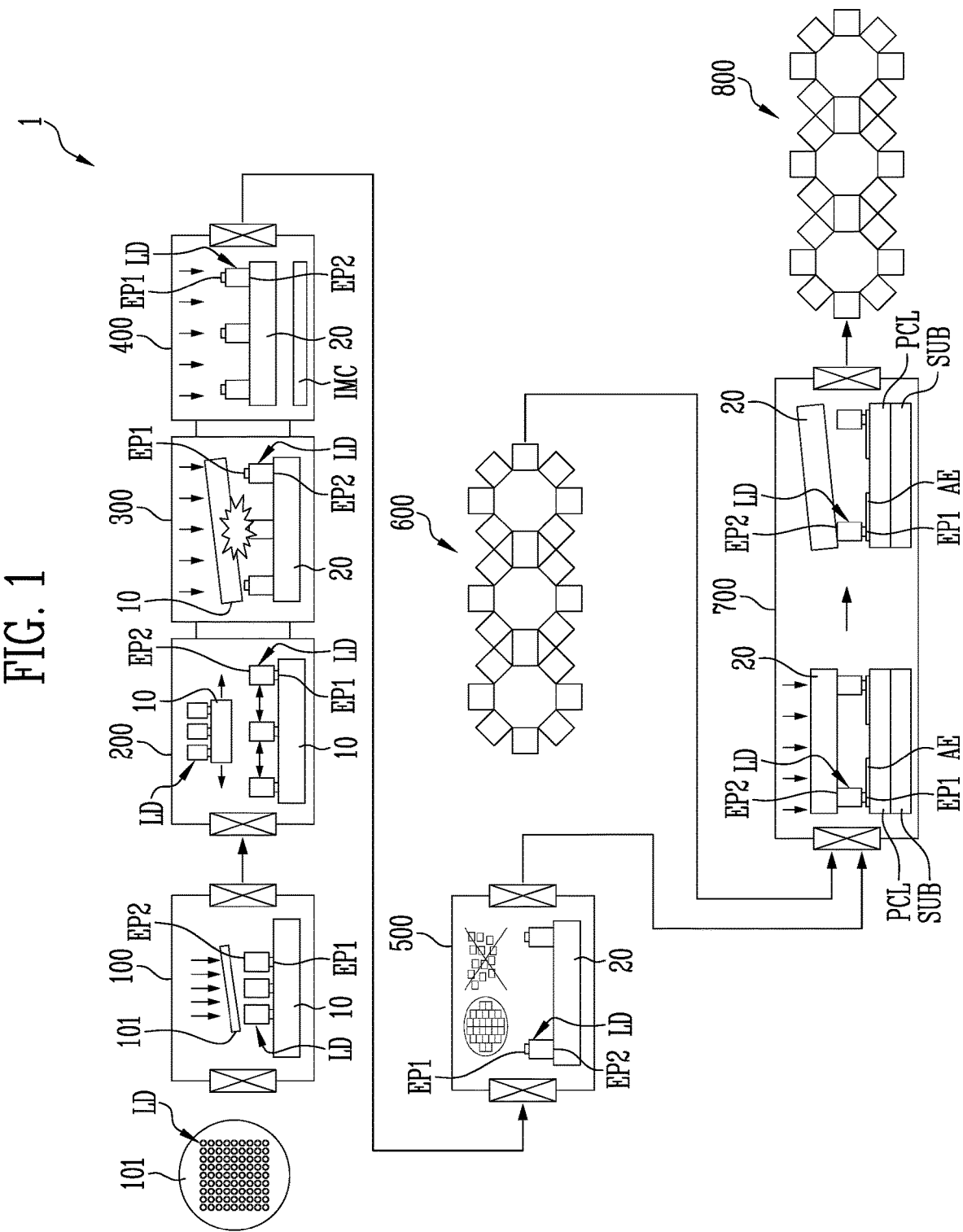
FIG. 1 illustrates a schematic view of a manufacturing apparatus of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
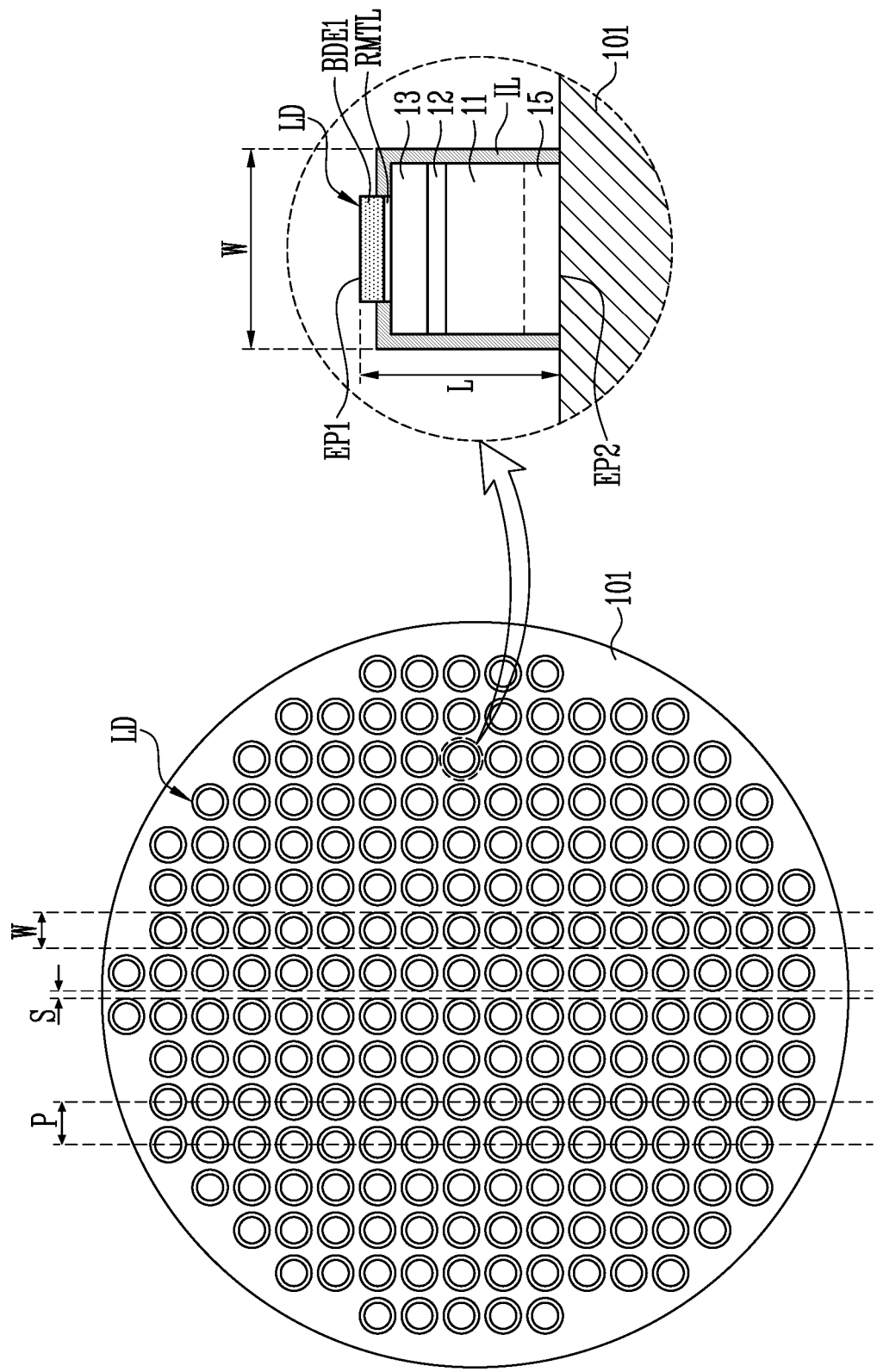
FIGS. 2-3 schematically illustrate light emitting elements grown on a growth substrate of FIG. 1.
Figure 3:
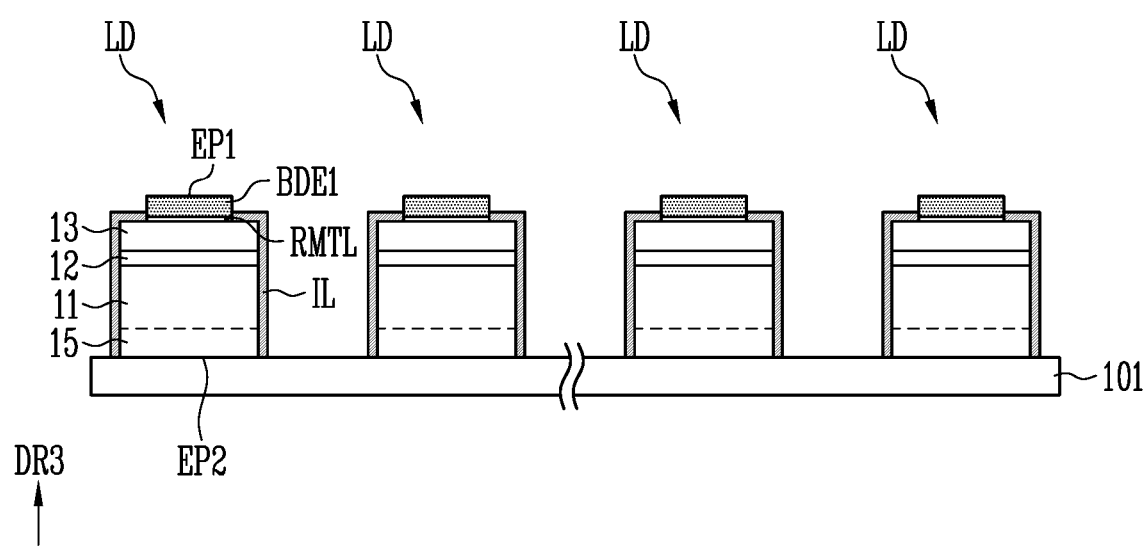
Figure 4:
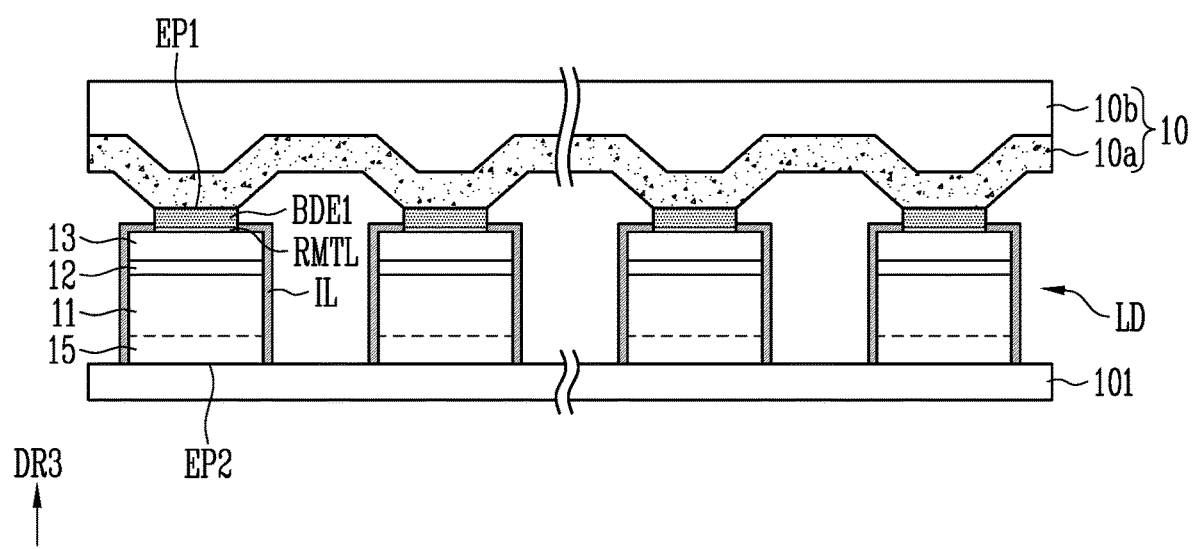
FIGS. 4-5 schematically illustrate a method of transferring light emitting elements to a first film in a first unit of FIG. 1.
Figure 5:
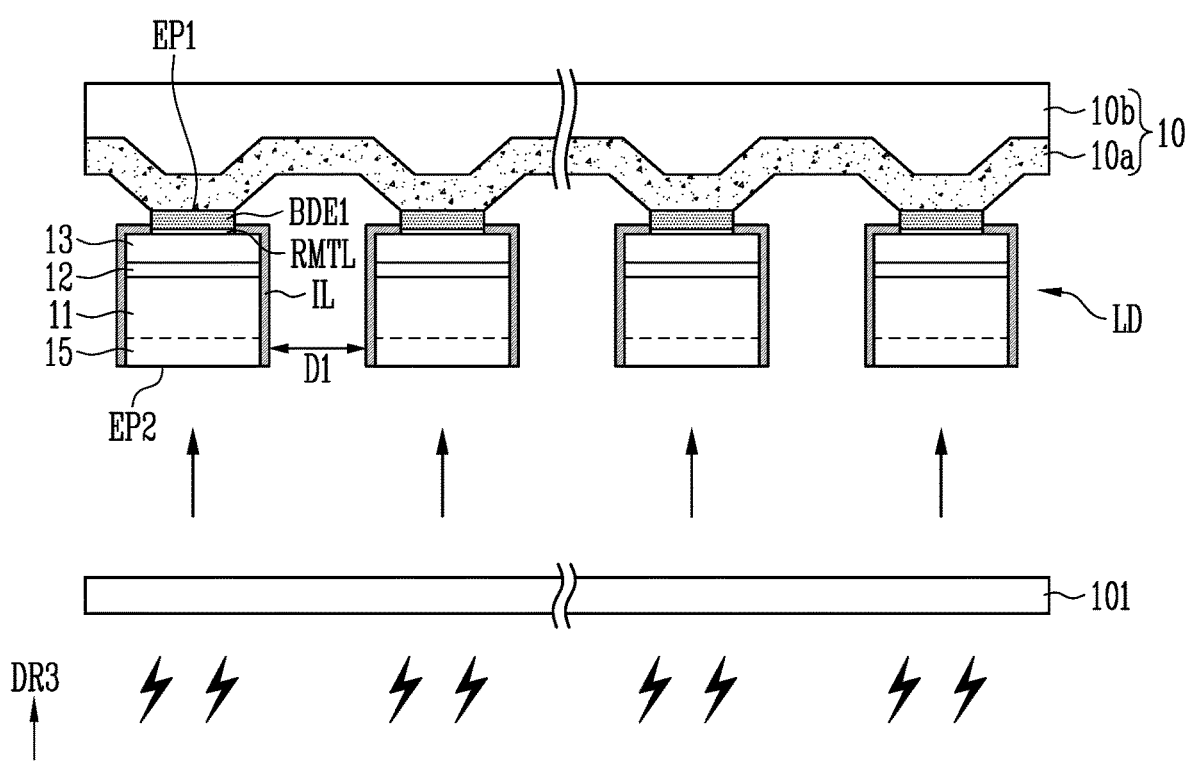
Figure 6:
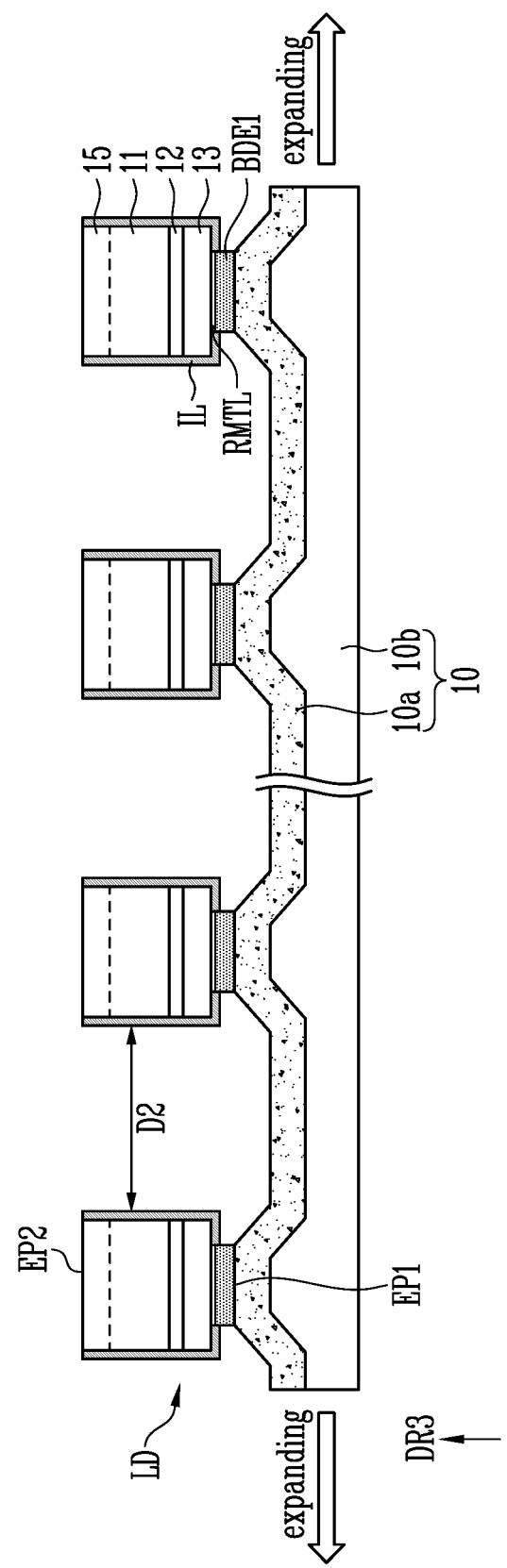
FIGS. 6-8 schematically illustrate a method of expanding a first film in a second unit of FIG. 1.
Figure 7:
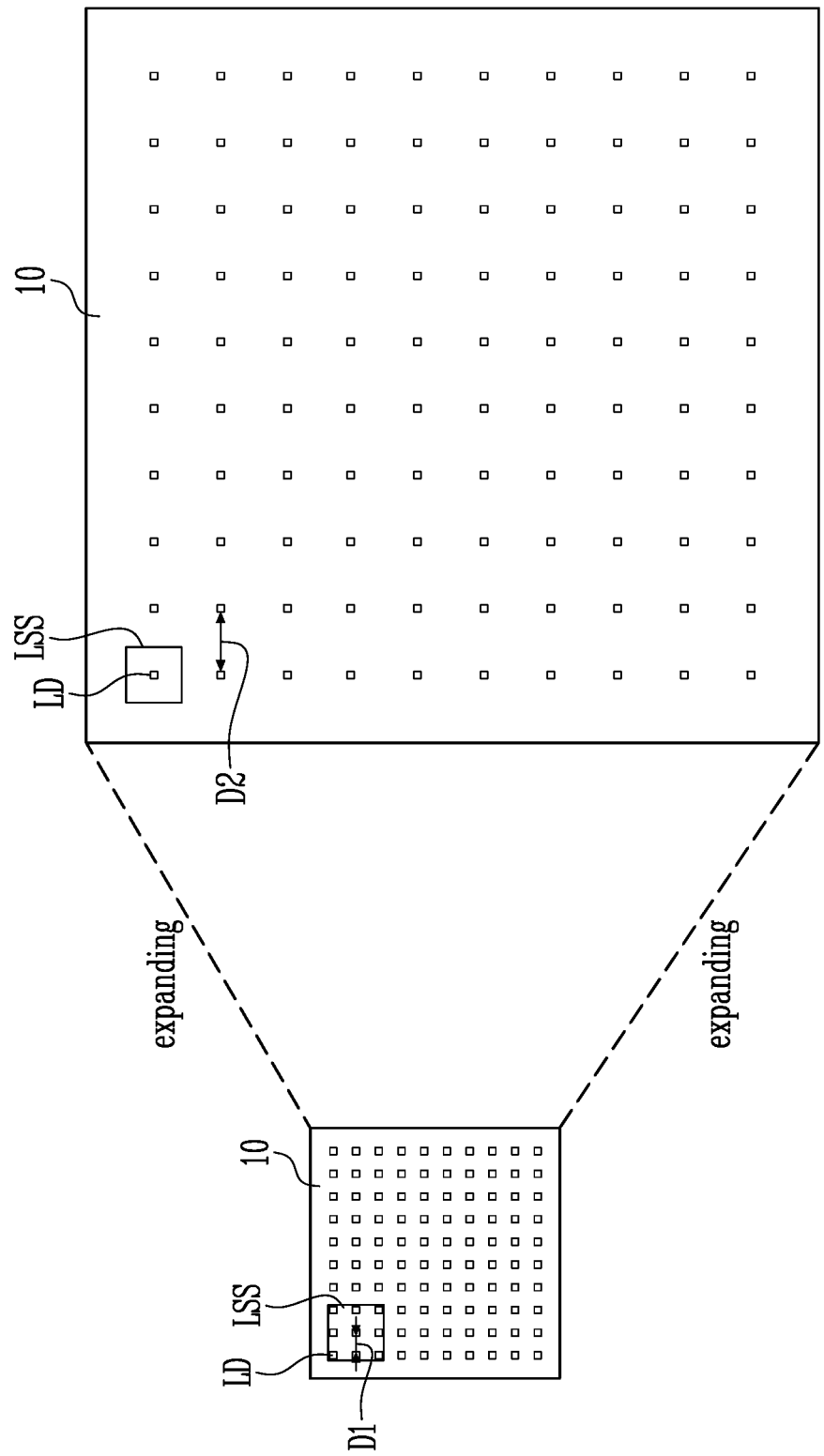
Figure 8:
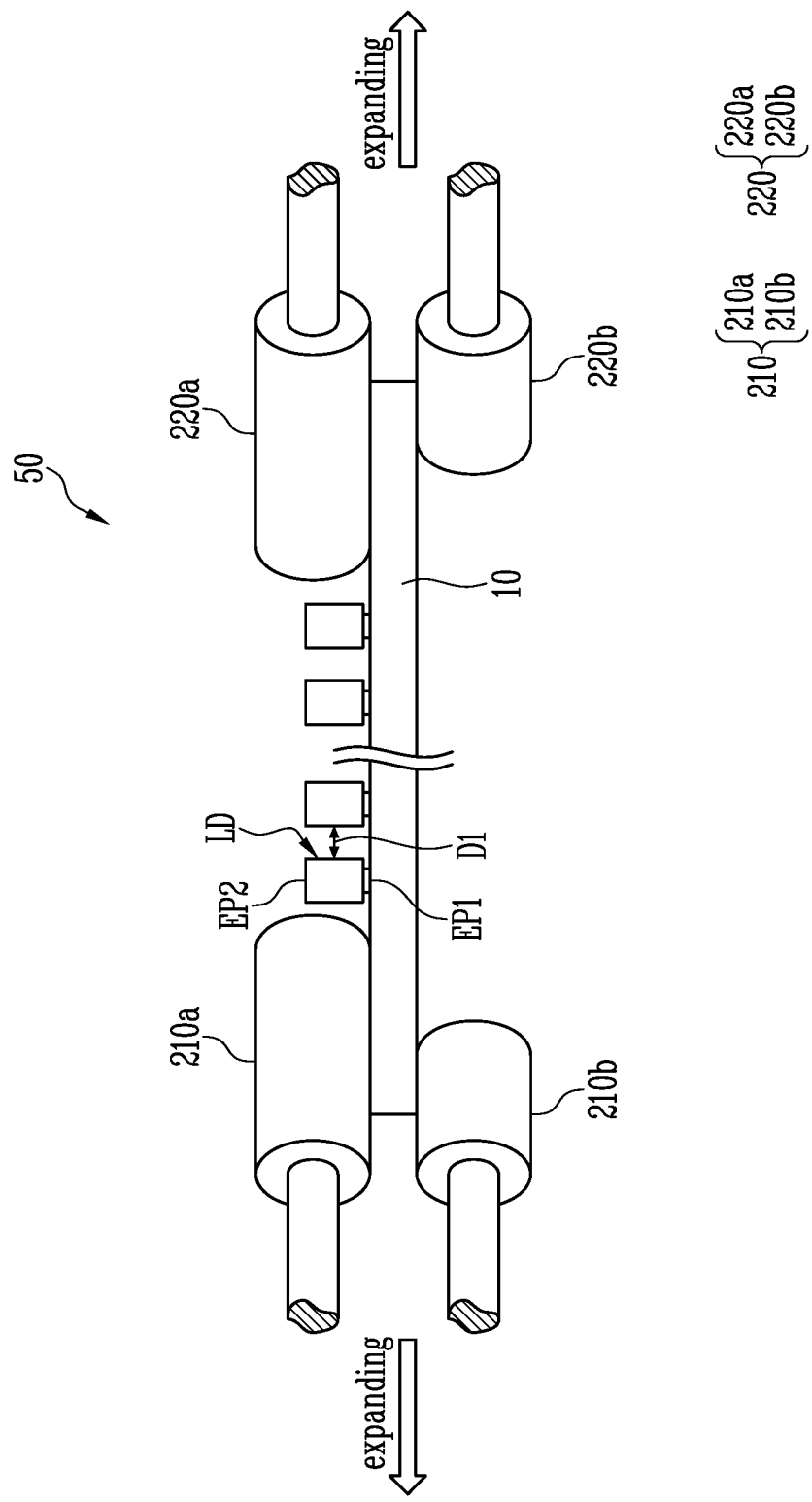
Figure 9:
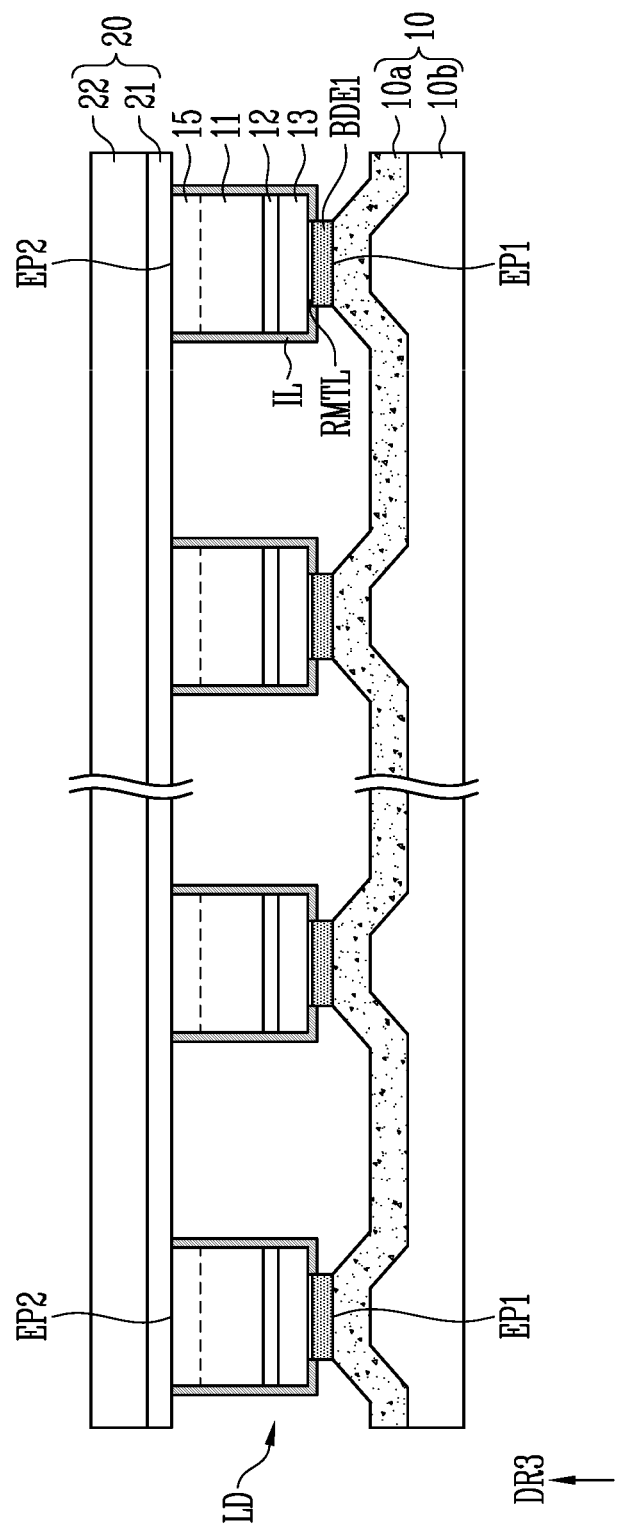
FIGS. 9-10 schematically illustrate a method of retransferring light emitting elements to a second film in a third unit of FIG. 1.
Figure 10:
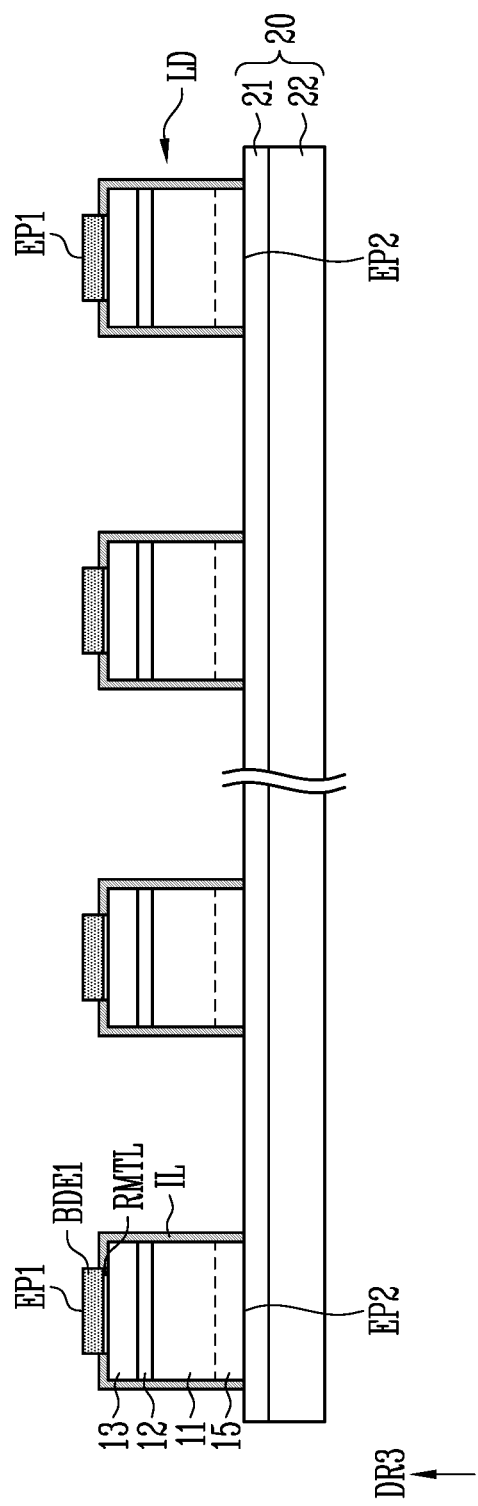
Figure 11:
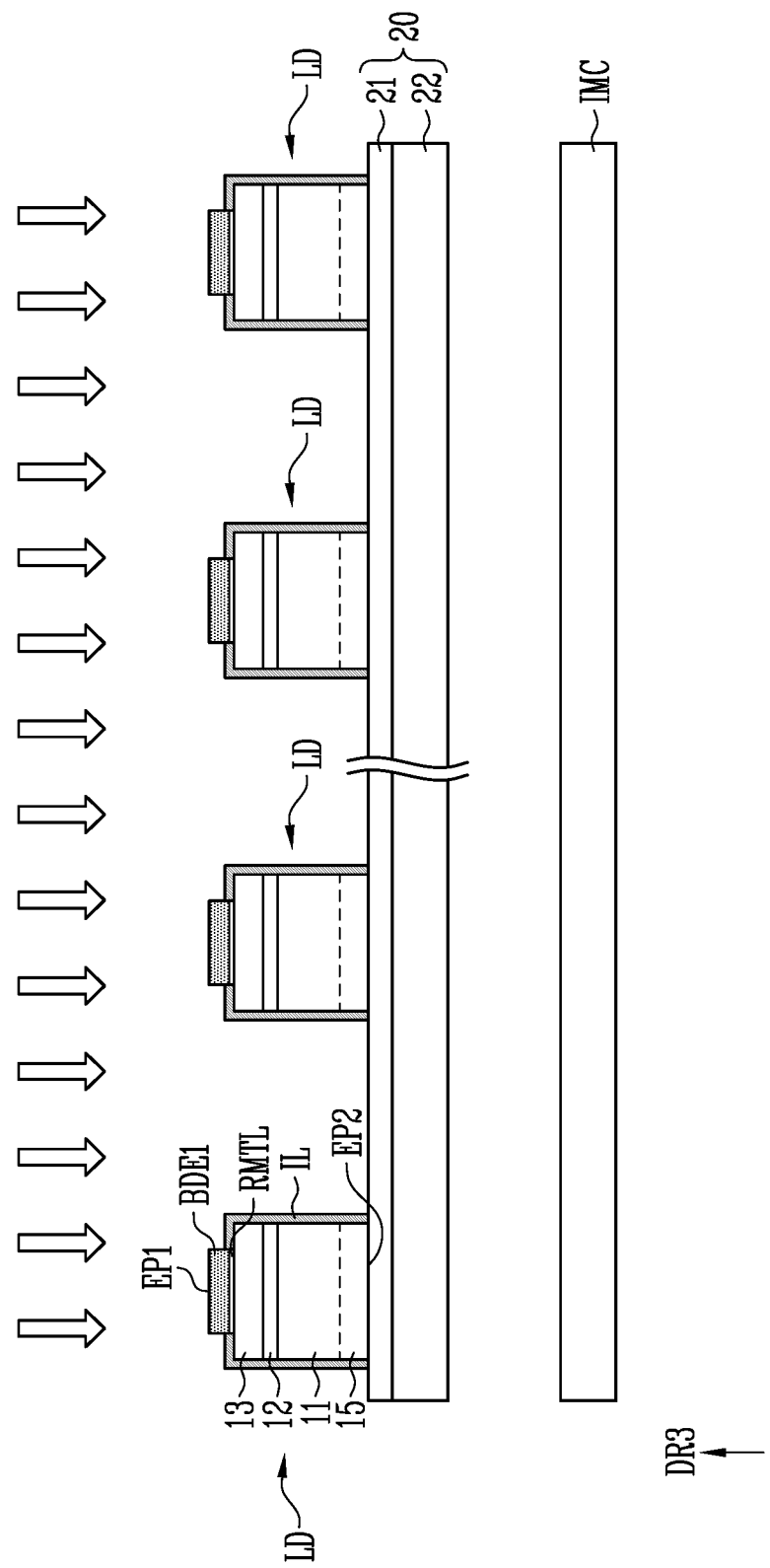
FIG. 11 schematically illustrates a method of determining positions of light emitting elements on a second film in a fourth unit of FIG. 1.
Figure 12:
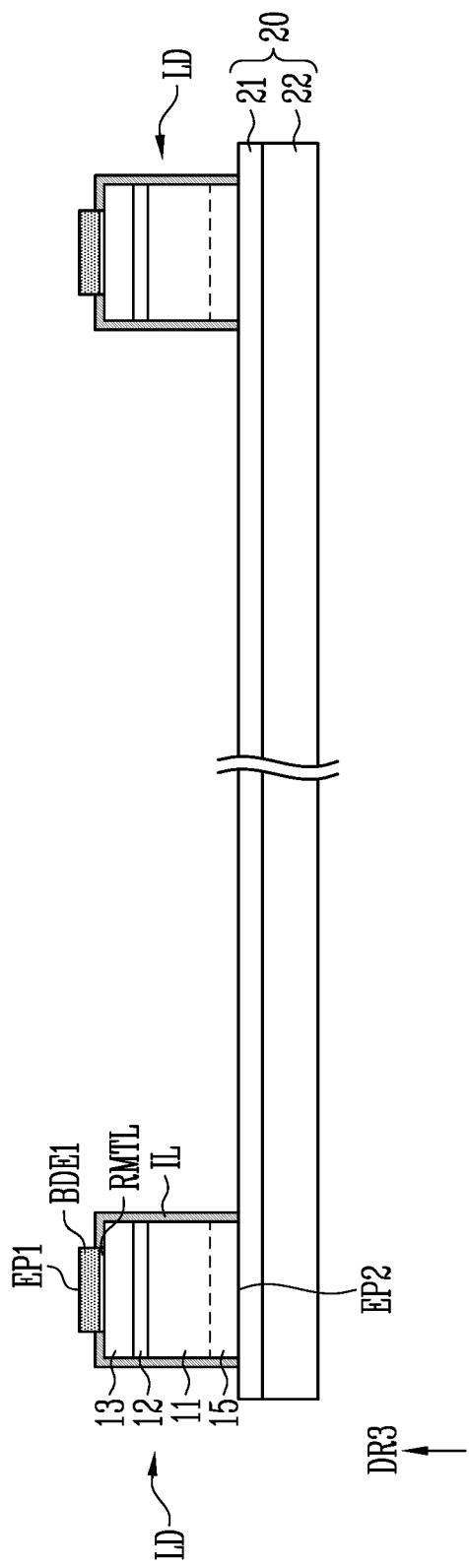
FIG. 12 schematically illustrates a method of binning light emitting elements on a second film in a fifth unit of FIG. 1.
Figure 13:
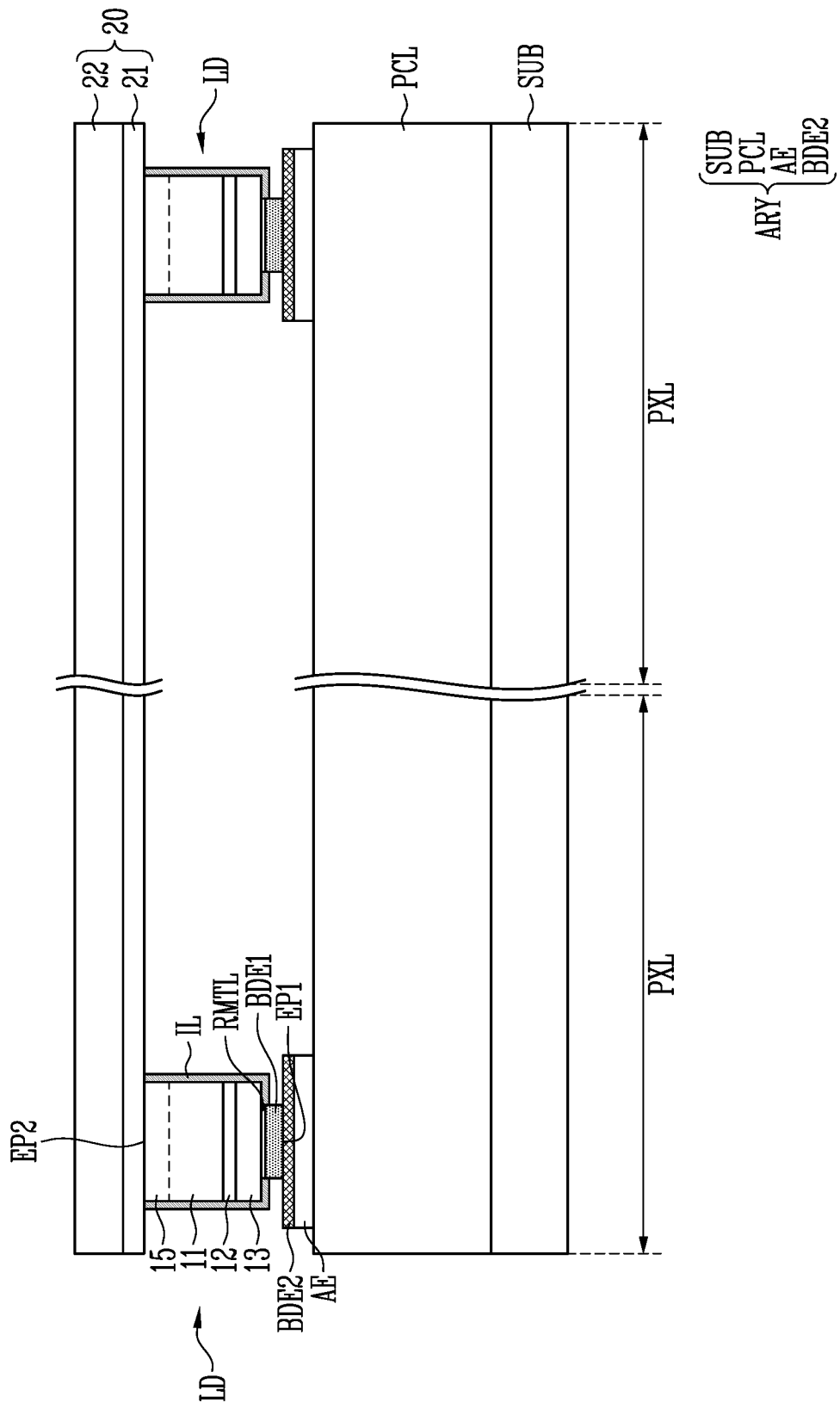
FIGS. 13-14 schematically illustrate a method of transferring light emitting elements on a second film onto a second bonding electrode of each pixel in a seventh unit of FIG. 1.
Figure 14:
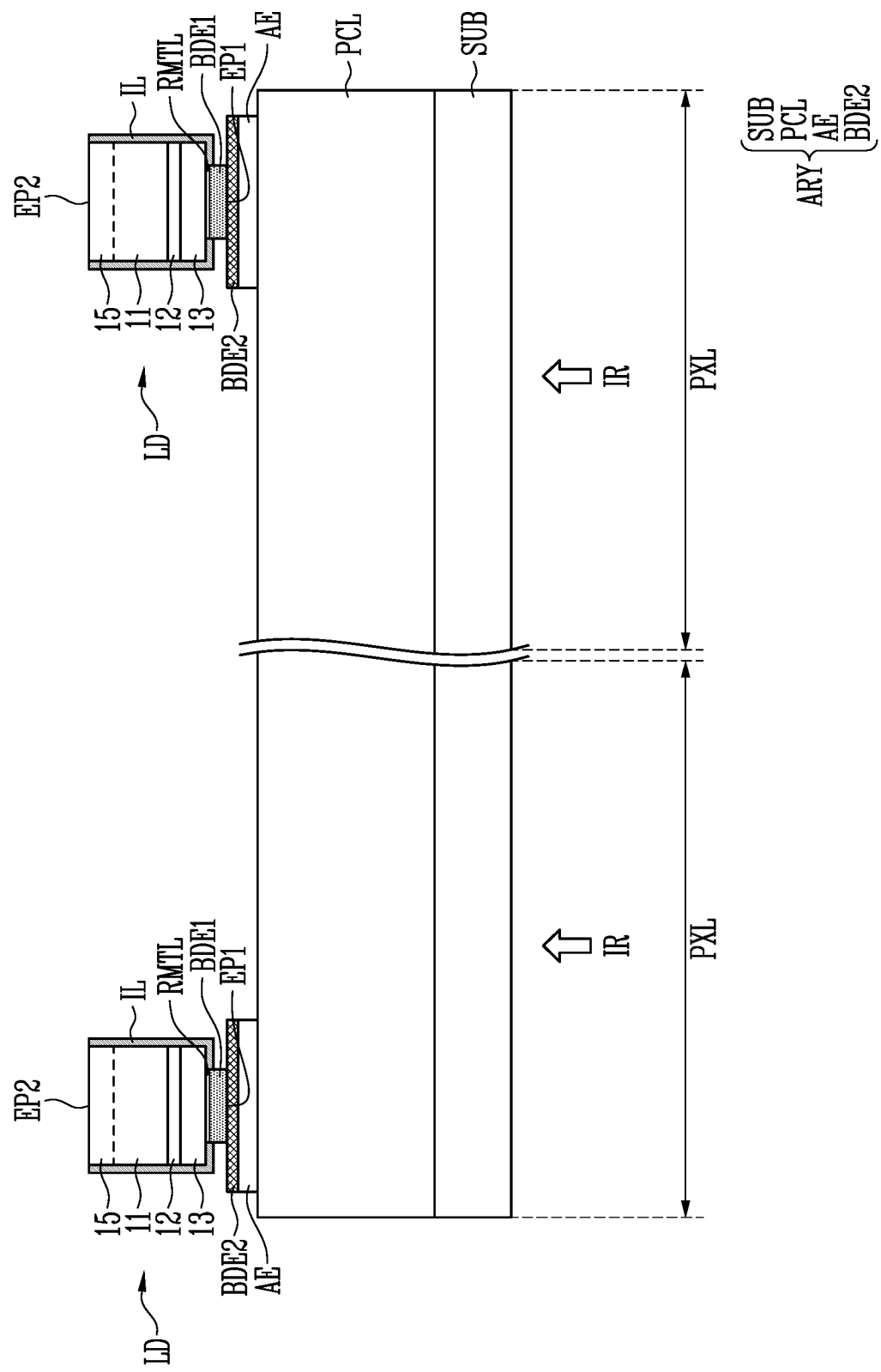
Figure 15:
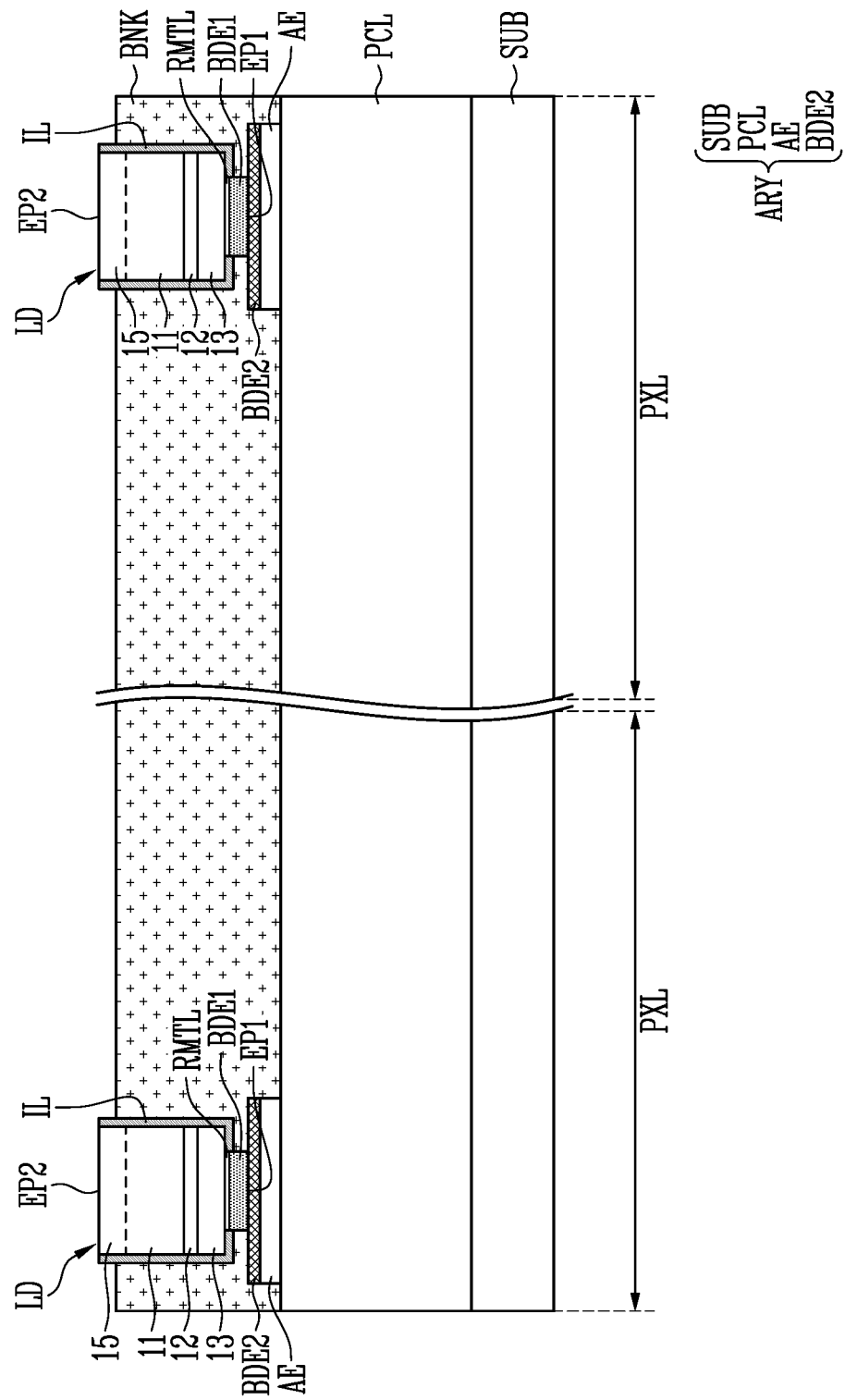
FIGS. 15-16 schematically illustrate a method of forming a bank and a second electrode on a light emitting element in a eighth unit of FIG. 1.
Figure 16:
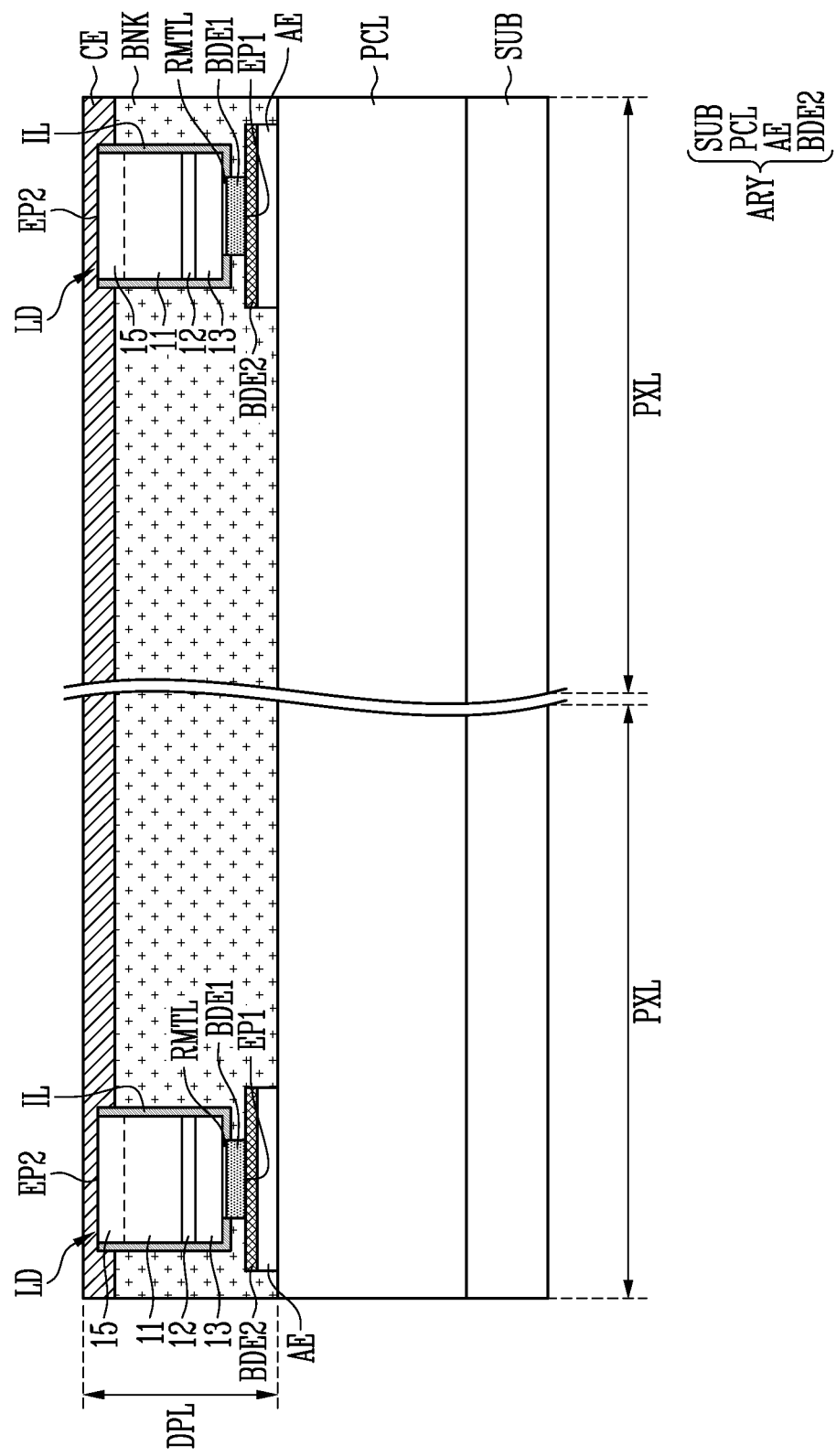

FIG. 1 illustrates a schematic view of a manufacturing apparatus 1 of a display device according to an embodiment of the present disclosure. FIGS. 2-3 schematically illustrate light emitting elements LD grown on a growth substrate 101 of FIG. 1. FIGS. 4-5 schematically illustrate a method of transferring light emitting elements LD to a first film 10 in a first unit 100 of FIG. 1. FIGS. 6-8 schematically illustrate a method of expanding a first film 10 in a second unit 200 of FIG. 1. FIGS. 9-10 schematically illustrate a method of retransferring light emitting elements LD to a second film 20 in a third unit 300 of FIG. 1. FIG. 11 schematically illustrates a method of determining positions of light emitting elements LD on a second film 20 in a fourth unit 400 of FIG. 1. FIG. 12 schematically illustrates a method of binning light emitting elements LD on a second film 20 in a fifth unit 500 of FIG. 1. FIGS. 13-14 schematically illustrate a method of transferring light emitting elements LD on a second film 20 onto a second bonding electrode BDE2 of each pixel in a seventh unit 700 of FIG. 1. FIGS. 15-16 schematically illustrate a method of forming a bank BNK and a second electrode CE on a light emitting element LD in a eighth unit 800 of FIG. 1.

For better comprehension and ease of description, in FIG. 1 to FIG. 16, a thickness direction of the growth substrate 101 and a length direction of the light emitting elements LD is shown as a third direction DR3.

Referring to FIG. 1 to FIG. 16, the manufacturing apparatus 1 of the display device according to one or more embodiments of the present disclosure may include the first to eighth units (e.g., first to eighth staging areas or chambers) 100 to 800. A separate conveying member, connecting member, and the like may be positioned between respective units to connect the respective units.

The manufacturing apparatus 1 of the display device may further include other units in addition to the units described above. In an embodiment, the manufacturing apparatus 1 of the display device may include all suitable apparatuses and structures for manufacturing a display device for displaying an image.

In an embodiment, the first unit 100 may include a transfer unit (e.g., a transfer device) for transferring the light emitting elements LD on the growth substrate 101 conveyed from a loading unit (e.g., a loading device) to the first film 10. A separate moving member, for example, such as a conveyor and/or the like, may be installed in the loading unit to convey the growth substrate 101 to the first unit 100.

The light emitting elements LD may be fabricated and positioned on the growth substrate 101 as shown in FIG. 2 and FIG. 3.

The growth substrate 101 may be formed as a conductive substrate or an insulating substrate. For example, the growth substrate 101 may include (e.g., may be made of) at least one of sapphire, SiC, Si, GaAs, GaN, ZnO, Si, GaP, InP, Ge, and/or $Ga_2O_3$.

Each light emitting element LD may emit light according to a recombination of electrons and holes according to a current flowing between a first end portion EP1 and a second end portion EP2. Accordingly, each light emitting element LD may be used as a light source (or a light emitting source) of various light emitting devices including a pixel PXL.

Each light emitting element LD may include a first semiconductor layer 11, a second semiconductor layer 13, and an active layer 12 interposed between the first semiconductor layer 11 and the second semiconductor layer 13. In some embodiments, the light emitting element LD may further include an auxiliary layer 15. The auxiliary layer 15 may be positioned on the first semiconductor layer 11. Each light emitting element LD may be implemented as a vertical type of light emitting laminate in which the auxiliary layer 15, the first semiconductor layer 11, the active layer 12, and the second semiconductor layer 13 are sequentially stacked on the growth substrate 101.

The light emitting element LD may be provided to have a shape extending in one direction. When an extending direction of the light emitting element LD is a length direction, the light emitting element LD may include the first end portion EP1 and the second end portion EP2 along the length direction. In an embodiment, the length direction may be parallel to or substantially parallel to a thickness direction (e.g., the third direction DR3) of the growth substrate 101. A first bonding electrode BDE1 positioned on the second semiconductor layer 13 may be positioned at the first end portion EP1 of the light emitting element LD, and the auxiliary layer 15 may be positioned at the second end portion EP2 of the light emitting element LD. However, the present disclosure is not limited thereto, and in some embodiments, the auxiliary layer 15 may be omitted, and in this case, the first semiconductor layer 11 may be positioned at the second end portion EP2 of the light emitting element LD.

For example, the light emitting element LD may include a light emitting diode (LED) manufactured to have a diameter and/or a length L of a nano scale to a micro scale. The size of the light emitting element LD may be variously modified according to (e.g., to meet) requirements or design conditions of a lighting device and a self-light emitting display device to which the light emitting element LD is applied.

In some embodiments, the auxiliary layer 15 may be stacked on the growth substrate 101, and may include a gallium nitride (GaN) semiconductor material doped with impurities. The auxiliary layer 15 may be provided to protect the active layer 12 from light caused by a laser lift-off process in the method of manufacturing the light emitting element LD, for example, such as a vertical light emitting element LD, but the present disclosure is not limited thereto. The auxiliary layer 15 may be selectively provided. For example, the auxiliary layer 15 may remain on the growth substrate 101 when the light emitting elements LD are separated from the growth substrate 101. In addition, in some embodiments, the auxiliary layer 15 may include (e.g., may be) a semiconductor layer that is integrally formed with the first semiconductor layer 11. In this case, the auxiliary layer 15 may include (e.g., may be) an N-type semiconductor layer.

For example, the first semiconductor layer 11 may include at least one N-type semiconductor layer. For example, the first semiconductor layer 11 may include a semiconductor material of one of InAlGaN, GaN, AlGaN, InGaN, AlN, and/or InN, and may be an N-type semiconductor layer doped with a first conductive dopant (or an N-type dopant), for example, such as Si, Ge, Sn, or the like. However, the material included in the first semiconductor layer 11 is not limited thereto, and the first semiconductor layer 11 may include (e.g., may be made of) various suitable materials. In an embodiment of the present disclosure, the first semiconductor layer 11 may include a gallium nitride (GaN) semiconductor material doped with the first conductive dopant (or the N-type dopant). In some embodiments, the first semiconductor layer 11 may form an N-type semiconductor layer of each of the light emitting elements LD together with the auxiliary layer 15.

The active layer 12 is disposed on the first semiconductor layer 11, and may be an area in which electrons and holes are recombined with each other. As the electrons and holes are recombined with each other in the active layer 12, they may transit to a low energy level, and accordingly, light having a wavelength corresponding thereto may be generated. The active layer 12 may include (e.g., may be made of), for example, a semiconductor material having a composition formula of InxAlyGa1-x-yN (0≤x≤1, 0≤y≤1, 0≤x+y≤1), and may be formed to have a single quantum well structure or multiple quantum well structure. For example, when the active layer 12 is formed of a multi-quantum well structure, the active layer 12 may have a structure in which a barrier layer, a strain reinforcing layer, and a well layer, which consist of one unit, are periodically and repeatedly stacked. However, the structure and material of the active layer 12 are not limited to those described above. The active layer 12 may include the first surface contacting the first semiconductor layer 11, and the second surface contacting the second semiconductor layer 13.

The second semiconductor layer 13 is disposed on the second surface of the active layer 12, and provides a hole in the active layer 12. The second semiconductor layer 13 may include a semiconductor layer of a type different from that of the first semiconductor layer 11. For example, the second semiconductor layer 13 may include at least one P-type semiconductor layer. For example, the second semiconductor layer 13 may include at least one semiconductor material of InAlGaN, GaN, AlGaN, InGaN, AlN, and/or InN, and may include a P-type semiconductor layer doped with a second conductive dopant (or a P-type dopant), for example, such as Mg, Zn, Ca, Sr, and/or Ba. However, the material included in the second semiconductor layer 13 is not limited thereto, and the second semiconductor layer 13 may be formed of various suitable materials. In an embodiment of the present disclosure, the second semiconductor layer 13 may include a gallium nitride (GaN) semiconductor material doped with the second conductive dopant (or the P-type dopant).

Each light emitting element LD may include a corresponding first bonding electrode BDE1 positioned on the second semiconductor layer 13. The first bonding electrode BDE1 may be bonded to the second bonding electrode BDE2 on a first electrode AE of each pixel, to electrically connect the light emitting element LD and the first electrode AE of each pixel PXL to each other. The first bonding electrode BDE1 may include (e.g., may be made of) a eutectic metal. For example, the first bonding electrode BDE1 may include SAC305 solder including (e.g., made of) a combination of tin (Sn), silver (Ag), and copper (Cu), or Au—Sn solder including (e.g., made of) a combination of gold (Au) and tin (Sn), but the present disclosure is not limited thereto.

Each light emitting element LD may be provided with a separate reflective electrode RMTL that is positioned between the second semiconductor layer 13 and the first bonding electrode BDE1 according to an embodiment, to reflect a guide laser beam irradiated from the fourth unit 400 in an upper direction of the light emitting element LD.

The reflective electrode RMTL may include (e.g., may be made of) a conductive material having a suitable reflectivity (e.g., a predetermined reflectivity). The conductive material may include an opaque metal. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof, but the material of the reflective electrode RMTL is not limited to those described above.

Each light emitting element LD may further include an insulating film IL. However, in some embodiments, the insulating film IL may be omitted, and/or may be provided to cover only a portion of the light emitting laminate.

The insulating film IL may include a transparent insulating material. For example, the insulating film IL may include one or more of a silicon oxide ($SiO_x$), a silicon nitride ($SiN_x$), a silicon oxynitride ($SiO_xN_y$), an aluminum oxide ($AlO_x$), a titanium oxide ($TiO_x$), a hafnium oxide ($HfO_x$), a titanium strontium oxide ($SrTiO_x$), a cobalt oxide ($Co_xO_y$), a magnesium oxide (MgO), zinc oxide ($ZnO_x$), a ruthenium oxide ($RuO_x$), a nickel oxide (NiO), a tungsten oxide ($WO_x$), a tantalum oxide ($TaO_x$), a gadolinium oxide ($GdO_x$), a zirconium oxide ($ZrO_x$), a gallium oxide ($GaO_x$), a vanadium oxide ($V_xO_y$), a ZnO:Al, a ZnO:B, a $In_xO_y$:H, a niobium oxide ($Nb_xO_y$), a magnesium fluoride ($MgF_x$), a fluorinated aluminum ($AlF_x$), an alucone polymer film, a titanium nitride (TiN), a tantalum nitride (TaN), an aluminum nitride ($AlN_x$), a gallium nitride (GaN), a tungsten nitride (WN), a hafnium nitride (HfN), a niobium nitride (NbN), a gadolinium nitride (GdN), a zirconium nitride (ZrN), and/or a vanadium nitride (VN), but the present disclosure is not limited thereto, and various suitable materials having insulating properties may be used as the material of the insulating film IL.

The insulating film IL may be provided in a form of a single layer (or a single film), or may be provided in a form of a multilayer (or a multifilm) including a double layer. For example, when the insulation film IL is configured as a double layer including a first insulating layer and a second insulating layer that are sequentially stacked, the first insulating layer and the second insulating layer may include (e.g., may be made of) different materials (or substances) from each other, and may be formed by different processes from each other. In some embodiments, the first insulating layer and the second insulating layer may include the same material as each other to be formed by a continuous process.

The insulating film IL may prevent or substantially prevent an electrical short circuit that may occur when the active layer 12 contacts conductive materials other than the first and second semiconductor layers 11 and 13. The insulating film IL may reduce surface defects of the light emitting element LD to improve a lifespan and a luminous efficiency of the light emitting element LD. In addition, when a plurality of light emitting elements LD are closely disposed on the growth substrate 101, the insulating film 14 may prevent or substantially prevent unwanted short circuits that may occur between the light emitting elements LD. However, the present disclosure is not limited thereto, and as long as the active layer 12 may prevent or substantially prevent a short circuit with an external conductive material from being caused, the insulating film IL may or may not be provided as needed or desired.

The insulating film IL may be provided in a form that entirely surrounds (e.g., around peripheries of) outer circumferential surfaces of the second semiconductor layer 13, the active layer 12, the first semiconductor layer 11, and the auxiliary layer 15, but the present disclosure is not limited thereto. The insulating film IL may not surround the outer circumferential surface of the first bonding electrode BDE1, so that the first bonding electrode BDE1 may be exposed to the outside for bonding with the second bonding electrode BDE2.

A plurality of light emitting elements LD formed on the growth substrate 101 may be cut by using a laser or the like along a cutting line, or may be individually separated through an etching process, and the plurality of light emitting elements LD may be in a state in which they may be separated from the growth substrate 101 through a laser lift-off process.

In FIG. 2, "P" refers to a pitch interval between the light emitting elements LD on the growth substrate 101, "S" refers to a separating distance between the light emitting elements LD (e.g., between adjacent ones of the light emitting elements LD), and "W" refers to a width of the light emitting element LD. FIG. 2 illustrates that the cross-sectional shape of the light emitting element LD is a quadrangular shape, but the present disclosure is not limited thereto, and a cross-sectional shape other than a quadrangular-shaped cross-section (e.g., a circular cross-section) may be formed according to a manufacturing method performed on the growth substrate 101.

Hereinafter, an example in which each light emitting element LD selectively includes the auxiliary layer 15, and the auxiliary layer 15 is a semiconductor layer doped with impurities that is electrically connected to the second electrode CE to be described in more detail below with reference to FIG. 16, will be described in more detail.

Before the light emitting elements LD that are manufactured on the growth substrate 101 are conveyed to the first unit 100, in some embodiments, an inspecting unit (e.g., an inspecting stage) may determine whether there are defects in the light emitting elements LD. The inspecting unit may include a camera, a lighting device, and a good/bad determiner (e.g., a good/bad determination processor). The camera may scan an image for alignment and inspection of the growth substrate 101 in a vertical direction (or an upper direction of the light emitting elements LD). The lighting device may irradiate an appropriate light, so that each light emitting element LD of the growth substrate 101 is visible during the scanning by the camera. Here, the lighting device may be disposed to be spaced apart from the camera. The good/bad determiner controls the camera and the lighting device to inspect an appearance of the light emitting elements LD on the growth substrate 101 according to a suitable inspection algorithm (e.g., a predetermined inspection algorithm). In other words, the good/bad determiner may determine a good chip and a bad chip by comparing the image of the light emitting elements LD scanned through the camera and the pattern of the image of the good light emitting element LD. In this case, the good/bad determiner may generate map data indicating good chips and bad chips as a result of the analysis of the light emitting elements 101 scanned through the camera. However, the determination of good or bad for the light emitting elements LD on the growth substrate 101 is not limited thereto.

The light emitting elements LD on the growth substrate 101 on which the good or bad determination has been completed may be conveyed to the first unit 100.

The first unit 100 connects (e.g., couples or attaches) the first film 10 and the light emitting elements LD to each other by arranging the first film 10 on the light emitting elements LD on the growth substrate 101. The first film 10 may be configured to provide the light emitting elements LD at a desired position (e.g., at a predetermined position) before performing a subsequent process (for example, such as a process of transferring (or arranging) the light emitting elements LD on a TFT array substrate (e.g., "ARY" in FIG. 13, which may be a structure including a substrate SUB, a pixel circuit layer PCL, a first electrode AE, and second bonding electrode BDE2)).

In an embodiment, the first film 10 (e.g., a donor film) may include (e.g., may be made of) an expandable material (or substance). The expandable material may be, for example, polyolefine, polyvinyl chloride (PVC), elastomeric silicone, elastomeric polyurethane, elastomeric polyisoprene, and/or the like, but the present disclosure is not limited thereto.

The first film 10 may include a first base substrate 10b, and a first bonding layer 10a disposed on the first base substrate 10b.

The first base substrate 10b may be transparent, so that light emitted from a light source may be transmitted therethrough, and may include (e.g., may be made of) a material having appropriate optical properties and sufficient mechanical stability. For example, the first base substrate 10b may include (e.g., may be) a glass substrate, a quartz substrate, and/or a synthetic resin substrate including (e.g., made of) a transparent polymer material, for example, such as polyester, polyacrylic, polyepoxy, polyethylene, polystyrene, or polyethylene terephthalate, which have excellent light transmission. However, the present disclosure is not limited thereto.

The first bonding layer 10a may include (e.g., may be made of) a transfer material, for example, such as an adhesive material, for bonding the light emitting elements LD. The first bonding layer 10a may include, for example, urethane acrylate, epoxy acrylate, polyester acrylate, and/or the like. The adhesive material included in the first bonding layer 10a may be a material of which adherence is changed as ultraviolet (UV) light or heat is applied thereto, and accordingly, the first bonding layer 10a may be easily separated from the transfer material. However, the material included in the first bonding layer 10a is not limited to those described above.

In an embodiment, the first bonding layer 10a may include a high modulus silicone adhesive having a thickness of about 5 μm to 100 μm in the third direction DR3, and the first base substrate 10b may include polyvinyl chloride (PVC) having a thickness of about 50 μm to 1000 μm in the third direction DR3.

The first unit 100 may dispose the first film 10 and the growth substrate 101 to be adjacent to each other, so that the first bonding layer 10a of the first film 10 faces an upper portion of the light emitting elements LD on the growth substrate 101. Accordingly, a plurality of light emitting elements LD formed on the growth substrate 101 may be adhered to the first bonding layer 10a of the first film 10.

In the first unit 100, the second end portion EP2 of each of the light emitting elements LD may contact the growth substrate 101, and the first end portion EP1 of each of the light emitting elements LD may contact the first bonding layer 10a of the first film 10, as shown in FIG. 4. In other words, in the first unit 100, the auxiliary layer 15 of each of the light emitting elements LD may contact the growth substrate 101, and the first bonding electrode BDE1 of each of the light emitting elements LD may contact the first film 10.

Referring to FIG. 5, in the first unit 100, the growth substrate 101 may be separated from the plurality of light emitting elements LD by a suitable method, for example, such as a laser lift off (LLO)) process or a chemical lift off (CLO) process. However, the separating method of the growth substrate 101 is not limited thereto.

Positions of the light emitting elements LD that are separated from the growth substrate 101 may be temporarily fixed on the first bonding layer 10a. For example, the plurality of light emitting elements LD may be disposed at a first distance D1 (or an undeformed distance) from each other. In other words, each of the light emitting elements LD may be spaced apart from an adjacent light emitting element LD on the first bonding layer 10a of the first film 10 by the first distance D1. In an embodiment, the first distance D1 may refer to a shortest separating distance between the light emitting elements LD that are adjacent to each other on the first film 10. For example, each of the light emitting elements LD may be spaced apart from a corresponding light emitting element LD that is adjacent thereto in one direction (e.g., a horizontal direction or vertical direction on a plane) on the first film 10 by the first distance D1.

The light emitting elements LD that are separated from the growth substrate 101 and transferred to the first film 10 may be conveyed to the second unit 200.

The second unit 200 may expand the first film 10 by using an expanding device 50 as shown in FIG. 8. For example, the first film 10 may be expanded in two-dimensional directions, which include a first direction (e.g., a horizontal direction in FIG. 7), and a second direction (e.g., a vertical direction in FIG. 7) perpendicular to or substantially perpendicular to the first direction. As the first film 10 is expanded, the first distance D1 between the plurality of light emitting elements LD fixed on the first film 10 increases to a second distance D2 (or a deformation distance) as shown in FIG. 6 and FIG. 7. In an embodiment, the second unit 200 may two-dimensionally expand the first film 10 by using the expanding device 50, so that each of the plurality of light emitting elements LD fixed on the first film 10 may be spaced apart from an adjacent light emitting element LD by the second distance D2, which is larger (or wider) than the first distance D1. Here, the second distance D2 may be 10 µm or more, and may be set to a suitable distance that does not affect the adjacent light emitting element LD when each of the light emitting elements LD is transferred to the TFT array substrate ARY by a laser shot (LSS) in the seventh unit 700. In other words, the second unit 200 two-dimensionally expands the first film 10 in order to limit the number of the light emitting elements LD that are transferred to the TFT array substrate ARY by one laser shot (LSS) to one in the seventh unit 700.

The above-described expanding device 50 may include a pair of expanders 210 and 220 extending end portions of the first film 10 to which the plurality of light emitting elements LD are fixed, respectively, in a width direction of the first film 10. Both shapes and dispositions of the pair of expanders 210 and 220 may be symmetrical or substantially symmetrical with each other. The pair of expanders 210 and 220 may include a first expander 210 fixed to one end (e.g., a left side) of the first film 10, and a second expander 220 fixed to another end (e.g., a right side) of the first film 10.

The first expander 210 may include a (1-1)-th expander 210a in contact with an upper surface of one end of the first film 10, and a (1-2)-th expander 210b in contact with a lower surface of the one end of the first film 10. The second expander 220 may include a (2-1)-th expander 220a in contact with an upper surface of the other end of the first film 10, and a (2-2)-th expander 220b in contact with a lower surface of the other end of the first film 10.

The first and second expanders 210 and 220 described above may include (e.g., may be made by) a suitable material from among various materials that do not scratch the surfaces of the first film 10. For example, a metal such as stainless steel, or a heat-resistant plastic such as bakelite may be used for the first and second expanders 210 and 220, but the present disclosure is not limited thereto.

After the first and second expanders 210 and 220 are fixed to respective ends of the first film 10, as shown in FIG. 8, the first and second expanders 210 and 220 may move in directions indicated by arrows (e.g., the width direction of the first film 10), so that the first film 10 may be expanded. However, the method of expanding the first film 10 is not limited thereto.

The distance between the light emitting elements LD fixed on the first film 10 is extended from the first distance D1 to the second distance D2 by a tensile force generated by the expanding of the first film 10. In an embodiment, the first film 10 may be expanded to have a density corresponding to that of the second bonding electrodes BDE2 of the pixels PXL (e.g., or sub-pixels) in which each of the plurality of light emitting elements LD is formed on the TFT array substrate ARY. In addition, the expanding operation may be repeatedly performed to obtain the first film 10 on which the light emitting elements LD having a desired density are disposed.

The first film 10 expanded by using the expanding device 50 in the second unit 200 may be conveyed to the third unit 300.

The third unit 300 disposes the second film 20 on the light emitting elements LD on the expanded first film 10 to retransfer the light emitting elements LD as the second film 20, and then removes the first film 10.

The second film 20 may be provided to expose the first bonding electrode BDE1 of each of the light emitting elements LD to the outside. In an embodiment, the second film 20 may include (e.g., may be made of) a material that may be easily separated from each of the light emitting elements LD by reacting to a laser beam.

In an embodiment, the second film 20 (e.g., a bonding film) may include a second base substrate 22, and a second bonding layer 21 disposed on the second base substrate 22.

The second base substrate 22 may be transparent, so that light emitted from a light source may be transmitted therethrough, and may include (e.g., may be made of) a material having appropriate optical properties and sufficient mechanical stability. The second bonding layer 21 may include (e.g., may be made of) an adhesive material for bonding the light emitting elements LD, which are retransfer materials. The second bonding layer 21 may include a material having a suitable adhesiveness, and the material may be selected as a material that may be easily separated from the light emitting elements LD by laser irradiation in a subsequent process.

The third unit 300 may dispose the second film 20 and the first film 10 to be adjacent to each other, so that the second bonding layer 21 of the second film 20 faces an upper portion of the light emitting elements LD on the expanded first film 10. Accordingly, a plurality of light emitting elements LD disposed on the expanded first film 10 may be adhered to the second bonding layer 21 of the second film 20.

In the third unit 300, the first end portion EP1 of each of the light emitting elements LD may contact the first film 10, and the second end portion EP2 of each of the light emitting elements LD may contact the second bonding layer 21 of the second film 20, as shown in FIG. 9. In other words, in the third unit 300, the first bonding electrode BDE1 of each of the light emitting elements LD may contact the first film 10, and the auxiliary layer 15 of each of the light emitting elements LD may contact the second film 20.

Referring to FIG. 10, in the third unit 300, the first film 10 may be separated from the light emitting elements LD by a physical method. In addition, in the third unit 300, the first film 10 may be separated from the light emitting elements LD after the adhesion of the first bonding layer 10a is weakened by the laser beam or heat irradiated to the upper surface thereof. In this case, the first bonding electrode BDE1 of each of the light emitting elements LD may be exposed.

The light emitting elements LD separated from the first film 10 may be temporarily fixed on the second bonding layer 21. Each of the light emitting elements LD retransferred to the second film 20 may be disposed to be spaced apart from an adjacent light emitting element LD on the second film 20 by the second distance (see "D2" in FIG. 6).

The light emitting elements LD separated from the first film 10 and retransferred to the second film 20 may be conveyed to the fourth unit 400.

The fourth unit 400 may check the positions of the light emitting elements LD by irradiating a guide laser beam onto the light emitting elements LD retransferred to the second film 20. For example, in the fourth unit 400, an image sensor IMC may be disposed on a back surface of the second film 20 to determine positions of the light emitting elements LD on the second film 20 according to whether the guide laser beam irradiated to the second film 20 and to the light emitting elements LD flows in.

The guide laser beam irradiated to the light emitting elements LD is reflected upwardly by the reflective electrode RMTL, and the guide laser beam does not pass through one area of the second film 20 at (e.g., in or on) which the light emitting elements LD are positioned, and thus, the light may not flow into the image sensor IMC. At (e.g., in or on) another area of the second film 20 in which the light emitting elements LD are not positioned, because the light emitting elements LD are not positioned thereon, the guide laser beam may pass through the second film 20 to flow into the image sensor IMC.

The image sensor IMC may output an electrical signal corresponding to the light received through the second film 20 as a sensing signal. The sensing signal output by the image sensor IMC may be used to identify the positions of the light emitting elements LD on the second film 20.

The positions of the light emitting elements LD in the fourth unit 400 may be checked to reduce missing of the laser shot LSS used in the seventh unit 700, by controlling the center (or middle) of the laser shot LSS used in the seventh unit 700 to be positioned at each of the light emitting elements LD. When the center of the laser shot LSS is positioned at each of the light emitting elements LD, and when each light emitting element LD is transferred to the TFT array substrate ARY, it may be possible to prevent or substantially prevent the adjacent light emitting element LD from being transferred to the same pixel (or the second bonding electrode BDE2 from being transferred on the same first electrode AE) of the TFT array substrate ARY.

The light emitting elements LD on the second film 20 of which the positions thereof are determined in the fourth unit 400 may be conveyed to the fifth unit 500.

The fifth unit 500 may group the light emitting elements LD of various luminances and colors by binning them in order to improve optical uniformity characteristics such as luminance and color uniformity of each pixel. In addition, the fifth unit 500 finally determines defective light emitting elements LD (or non-effective light sources) from among the light emitting elements LD on the second film 20 to irradiate a laser beam to the defective light emitting elements LD, so that the defective light emitting elements LD may be separated from the second film 20. Accordingly, as shown in FIG. 12, only the light emitting elements LD that are effective light sources may be finally positioned on the second film 20.

The light emitting elements LD binned in the fifth unit 500 may be conveyed to the seventh unit 700.

Meanwhile, the sixth unit 600 may form the TFT array substrate ARY of the plurality of pixels PXL. In more detail, the sixth unit 600 forms the TFT array substrate ARY including a substrate SUB, a pixel circuit layer PCL, a first electrode AE, and a second bonding electrode BDE2. The TFT array substrate ARY may include the substrate SUB, the pixel circuit layer PCL formed on the substrate SUB, the first electrode AE formed on the pixel circuit layer PCL, and the second bonding electrode BDE2 formed on the first electrode AE, of each of the pixels PXL.

The first electrode AE may be electrically connected to at least one transistor provided in the pixel circuit layer PCL to be electrically connected to the light emitting element LD by a subsequent process (a process of bonding the light emitting element LD with the second bonding electrode BDE2).

The first electrode AE may include (e.g., may be made of) a conductive material (or substance) having a suitable reflectance (for example, a predetermined reflectance) in order to direct the light emitted from the light emitting element LD in a desired direction. The conductive material may include an opaque metal for reflecting the light emitted from the light emitting elements LD in a desired direction (for example, an image display direction of a display device). The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof. In some embodiments, the first electrode AE may also include a transparent conductive material (or substance). The transparent conductive material (or substance) may include a conductive oxide, for example, such as an indium tin oxide (ITO), an indium zinc oxide (IZO), a zinc oxide ($ZnO_x$), an indium gallium zinc oxide (IGZO), and/or an indium tin zinc oxide (ITZO), and a conductive polymer, for example, such as poly(3,4-ethylenedioxythiophene (PEDOT). When the first electrode AE includes the transparent conductive material (or substance), a separate conductive layer including (e.g., made of) an opaque metal may also be added to reflect the light emitted from each of the light emitting elements LD in the image display direction of the display device. However, the material of the first electrode AE is not limited to the above-described materials.

The first electrode AE may be provided and/or formed as a single layer, but the present disclosure is not limited thereto. In some embodiments, the first electrode AE may be provided and/or formed as a multi-layered layer in which at least two or more of metals, alloys, conductive oxides, or conductive polymers are stacked. The first electrode AE may be formed as a multilayer of at least a double layer or more to minimize or reduce distortion due to signal delay when a signal (or voltage) is transmitted to the first end portion EP1 of the light emitting element LD.

The second bonding electrode BDE2 is a medium that electrically connects the first electrode AE and the light emitting element LD to each other, and may be bonded to the first bonding electrode BDE1 of the light emitting element LD. The second bonding electrode BDE2 may include (e.g., may be made of) the same or substantially the same material as that of the first bonding electrode BDE1, but the present disclosure is not limited thereto. In some embodiments, the second bonding electrode BDE2 may include (e.g., may be made of) a conductive material (or substance) having a constant or substantially constant reflectivity. The conductive material (or substance) may include an opaque metal for reflecting light emitted from the active layer 12 of the light emitting element LD in a desired direction. The opaque metal may include, for example, silver (Ag), magnesium (Mg), aluminum (Al), platinum (Pt), palladium (Pd), gold (Au), nickel (Ni), neodymium (Nd), iridium (Ir), chromium (Cr), titanium (Ti), and/or an alloy thereof.

The TFT array substrate ARY formed in the sixth unit 600 may be conveyed to the seventh unit 700.

As shown in FIG. 13, the seventh unit 700 positions the light emitting elements LD on the second film 20 conveyed from the fifth unit 500 above the TFT array substrate ARY of the plurality of pixels PXL, and then transfers the light emitting elements LD onto the TFT array substrate ARY. In addition, the seventh unit 700 bonds some components of the TFT array substrate ARY with the light emitting elements LD, and removes the second film 20.

The seventh unit 700 may individually transfer each of the light emitting elements LD on the second film 20 to a desired position (e.g., a predetermined position) on the TFT array substrate ARY (e.g., to an upper portion of the second bonding electrode BDE2 on a corresponding first electrode AE of a corresponding pixel PXL).

The seventh unit 700 irradiates a laser beam (or laser) to each of the light emitting elements LD on the second film 20 by using the laser shot LSS. In this case, the position of the laser shot LSS is controlled, so that the center of the laser shot LSS corresponds to the light emitting element LD. As an example, when 20 pixels PXL are provided on the TFT array substrate ARY, the seventh unit 700 may irradiate a laser beam with 20 laser shots to the second film 20 to transfer one light emitting element LD to the upper portion of the second bonding electrode BDE2 of each of the 20 pixels PXL. In other words, the seventh unit 700 may irradiate a laser beam to one light emitting element LD on the second film 20 with a single laser shot to transfer the one light emitting element LD on the second bonding electrode BDE2 of one pixel PXL. Accordingly, one light emitting element LD may be individually transferred for each pixel PXL.

As shown in FIG. 14, after one corresponding light emitting element LD is transferred to each of the pixels PXL, the seventh unit 700 irradiates a laser beam (for example, an infrared laser beam IR) on the rear surface of the TFT array substrate ARY to bond the first bonding electrode BDE1 of each of the light emitting elements LD to a corresponding second bonding electrode BDE2 of the TFT array substrate ARY. In more detail, when a laser beam is irradiated to bond the first bonding electrode BDE1 of each of the light emitting elements LD to a corresponding second bonding electrode BDE2 of the TFT array substrate ARY, an intermetallic compound may be generated and grown between the first bonding electrode BDE1 and the second bonding electrode BDE2. Due to the intermetallic compound, the light emitting element LD and the first electrode AE of each pixel may be electrically connected to each other. However, the bonding method of the first bonding electrode BDE1 and the second bonding electrode BDE2 is not limited thereto. The bonding method may be an anisotropic conductive film (AFC) bonding method, an ultrasonic bonding method, a ball grid array (BGA) method, a thermo compression bonding (TC) method, or the like.

The seventh unit 700 irradiates a laser beam on the upper surface of the second film 20 to separate the light emitting elements LD and the second film 20 that are bonded to a part of the TFT array substrate ARY. Accordingly, the light emitting elements LD may be finally transferred onto the TFT array substrate ARY. However, the method of removing the second film 20 is not limited thereto. As described above, as the second film 20 is removed, the auxiliary layer 15 positioned at the second end portion EP2 of each of the light emitting elements LD bonded to the TFT array substrate ARY may be exposed.

In the seventh unit 700, the light emitting elements LD bonded to the TFT array substrate ARY may be conveyed to the eighth unit 800.

In the eighth unit 800, the bank BNK and the second electrode CE are formed on the light emitting elements LD.

In more detail, in the eighth unit 800, the bank BNK is formed on the TFT array substrate ARY to which the plurality of light emitting elements LD are transferred, as shown in FIG. 15. The bank BNK is configured to include at least one light blocking material and/or reflective material (or scattering material) to prevent or substantially prevent a defect in which light leaks between adjacent pixels PXL. In some embodiments, the bank BNK may include (e.g., may be) an organic insulating film including an organic material. For example, the bank BNK may be formed as an organic insulating film including (e.g., made of) an acrylic resin, an epoxy resin, a phenolic resin, a polyamide resin, a polyimide resin, or the like. In some embodiments, the bank BNK may prevent or substantially prevent oxygen and moisture from penetrating into the light emitting elements LD.

The bank BNK may be formed on the light emitting elements LD to sufficiently cover the light emitting elements LD, and may then be etched to expose the auxiliary layer 15 positioned at the second end portion EP2 of each of the light emitting elements LD.

In the eighth unit 800, as shown in FIG. 16, the second electrode CE may be entirely formed on the light emitting elements LD to which the second end portion EP2 is exposed.

The second electrode CE may be entirely formed on the second end portion EP2 of each of the light emitting elements LD and the bank BNK. The second electrode CE may contact the second end portion EP2 of each of the light emitting elements LD to be electrically connected to the second end portion EP2 of each of the light emitting elements LD. For example, the second electrode CE may be electrically connected to the auxiliary layer 15 positioned at the second end portion EP2 of each of the light emitting elements LD.

The second electrode CE may include (e.g., may be made of) various suitable transparent conductive materials to transmit light emitted from the light emitting elements LD without loss. For example, the second electrode CE may include at least one of various suitable transparent conductive materials (or substances), for example, such as an indium tin oxide (ITO), an indium zinc oxide (IZO), a zinc oxide ($ZnO_x$), an indium gallium zinc oxide (IGZO), and/or an indium tin zinc oxide (ITZO), and may be formed to be transparent or substantially transparent or translucent to satisfy a suitable or desired light transmittance (e.g., a predetermined light transmittance). However, the material of the second electrode CE is not limited to those described above.

In the eighth unit 800, at least one or more passivation layers and/or at least one or more insulating layers to protect the second electrode CE may be further formed on the second electrode CE.

The manufacturing apparatus 1 of the display device according to one or more of the above-described embodiments may expand the first film 10 in the second unit 200 to secure a distance between the light emitting elements LD, may accurately determine the positions of the light emitting elements LD in the fourth unit 400, and may then transfer one light emitting element LD to one pixel PXL with one laser shot LSS at a time in the seventh unit 700. In other words, the manufacturing apparatus 1 according to one or more embodiments may transfer only one light emitting element LD to one pixel PXL of the TFT array substrate ARY at a time, and thus, the number of light emitting elements LD lost in the transfer process may be reduced.

In addition, the manufacturing apparatus 1 of the display device according to one or more of the above-described embodiments allows one light emitting element LD to be transferred onto the second bonding electrode BDE2 of one pixel PXL at a time, and thus, a process defective rate that may occur during the transfer process may be reduced.

Further, the manufacturing apparatus 1 of the display device according to one or more of the above-described embodiments irradiates a guide laser beam in the fourth unit 400 to accurately determine the positions of the light emitting elements LD on the second film 20 by using a sensing signal output from the image sensor IMC, so that the position of the laser shot LSS used to transfer each of the light emitting elements LD onto the TFT array substrate ARY may be more easily controlled to individually transfer one light emitting element LD to the corresponding pixel PXL at a time.

Figure 17:
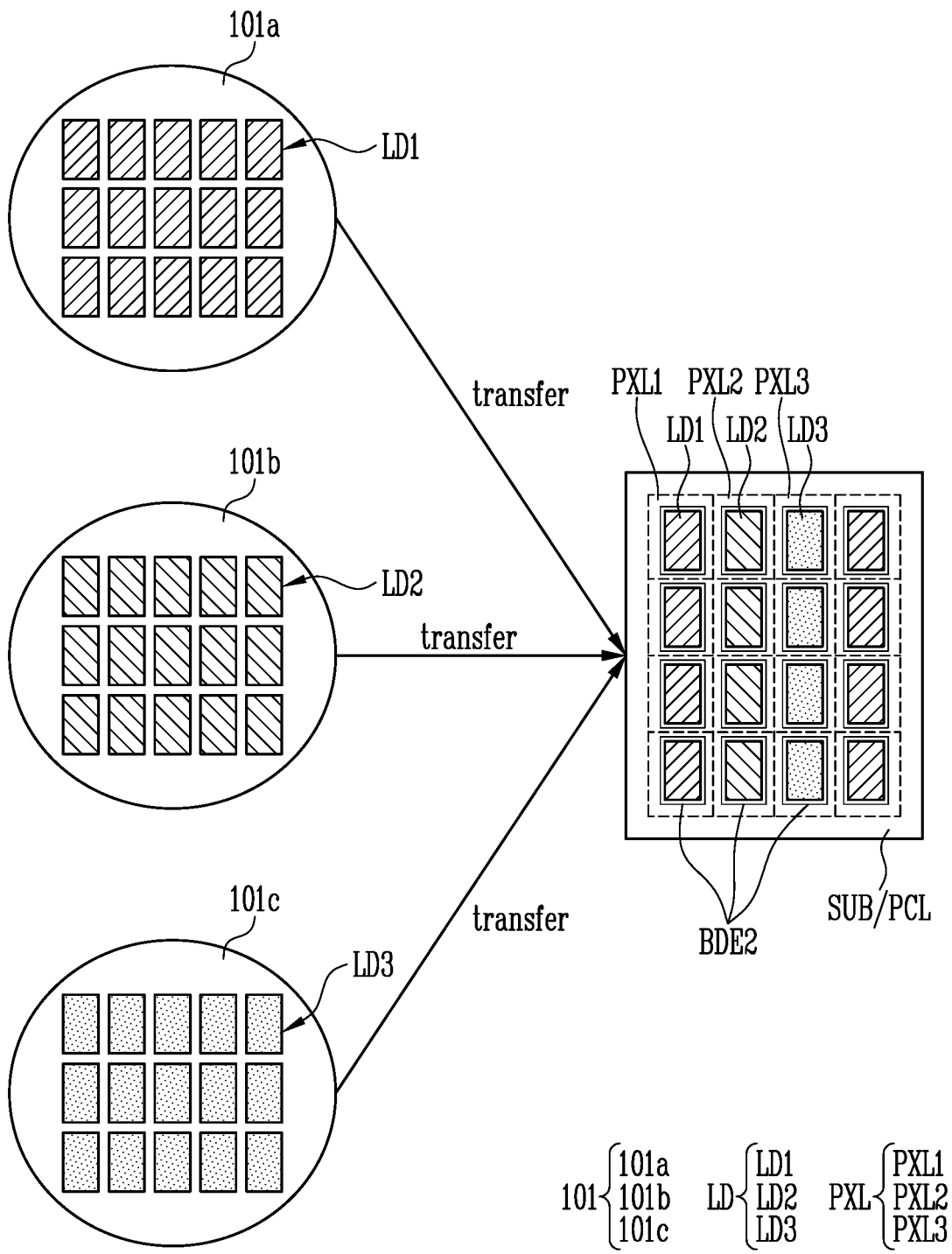
FIGS. 17-18 schematically illustrate light emitting elements disposed in a pixel by using the manufacturing apparatus of the display device of FIG. 1.
Figure 18:
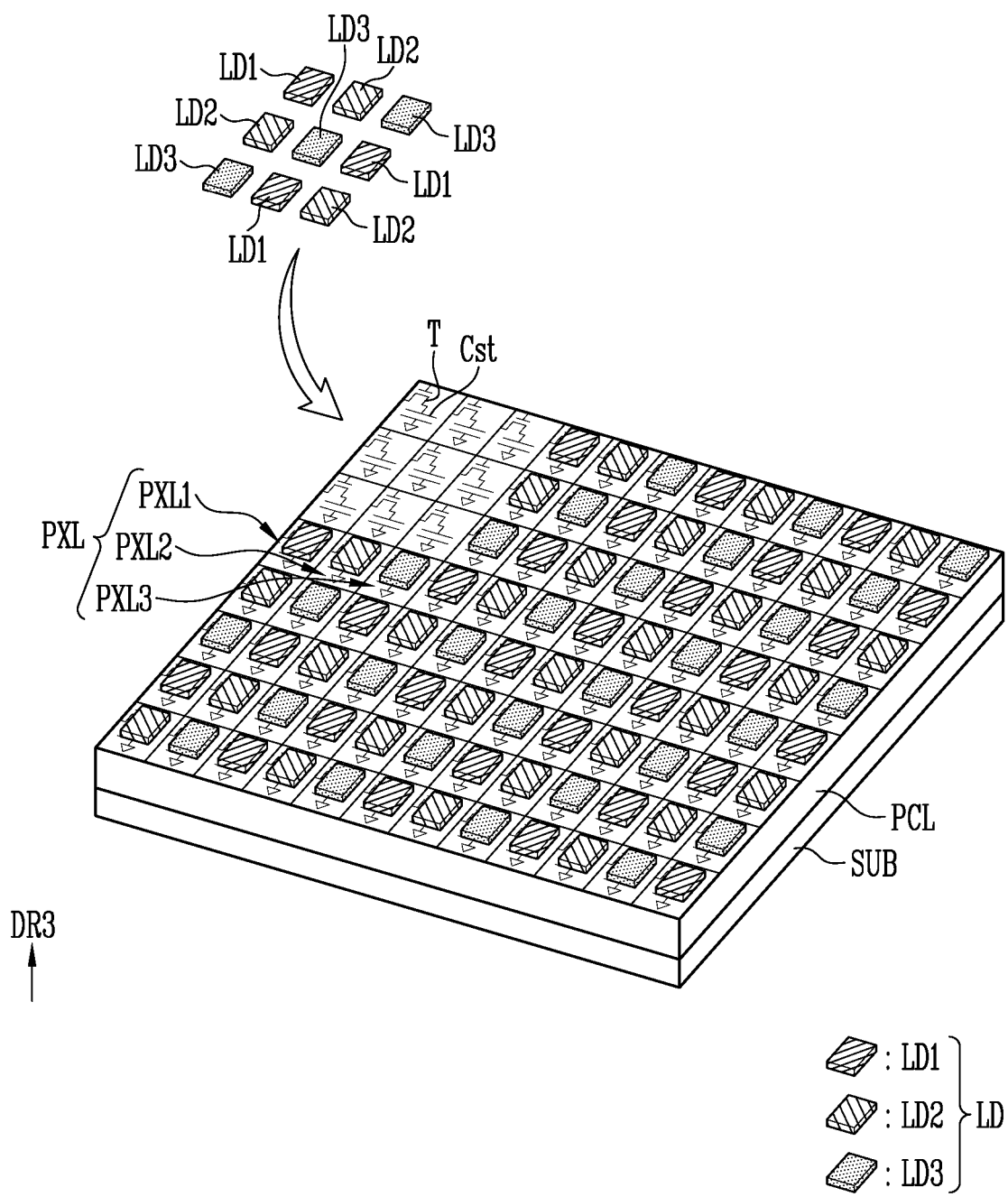

FIG. 17 and FIG. 18 schematically illustrate the light emitting elements LD disposed in the pixel PXL by using the manufacturing apparatus 1 of the display device of FIG. 1.

Referring to FIG. 1 to FIG. 18, the plurality of pixels PXL may include the TFT array substrate ARY.

The TFT array substrate ARY may include the substrate SUB, the pixel circuit layer PCL, and a portion of a display element layer DPL. The portion of the display element layer DPL may include (e.g., may be) the first electrode AE, and the second bonding electrode BDE2 may be positioned on the first electrode AE. The first electrode AE may be provided for each pixel PXL. The pixel circuit layer PCL may include at least one transistor T and at least one storage capacitor Cst.

In an embodiment, the pixels PXL may include a first pixel PXL1, a second pixel PXL2, and a third pixel PXL3. The first pixel PXL1 may be a red pixel, the second pixel PXL2 may be a green pixel, and the third pixel PXL3 may be a blue pixel.

One light emitting element LD may be provided (or disposed) in each of the pixels PXL. For example, one first light emitting element LD1 may be provided in the first pixel PXL1, one second light emitting element LD2 may be provided in the second pixel PXL2, and one third light emitting element LD3 may be provided in the third pixel PXL3.

The first, second, and third light emitting elements LD1, LD2, and LD3 may emit different colors of light from each other. For example, the first light emitting element LD1 may emit red light, the second light emitting element LD2 may emit green light, and the third light emitting element LD3 may emit blue light. However, the present disclosure is not limited thereto, and in some embodiments, the first, second, and third light emitting elements LD1, LD2, and LD3 may emit light of the same color as each other. For example, the first, second, and third light emitting elements LD1, LD2, and LD3 may each emit blue light.

Each of the first, second, and third light emitting elements LD1, LD2, and LD3 may be manufactured on the corresponding growth substrate 101, and then may be transferred to the corresponding pixel PXL of the TFT array substrate ARY by the manufacturing apparatus 1 of the display device.

The first light emitting element LD1 may be manufactured on a first growth substrate 101a, and then may be passed through the first to seventh units 100 to 700 of the manufacturing apparatus 1 of the display device to be transferred to the second bonding electrode BDE2 of the corresponding first pixel PXL1 of the TFT array substrate ARY.

The second light emitting element LD2 may be manufactured on a second growth substrate 101b, and then may be passed through the first to seventh units 100 to 700 of the manufacturing apparatus 1 of the display device to be transferred to the second bonding electrode BDE2 of the corresponding second pixel PXL2 of the TFT array substrate ARY.

The third light emitting element LD3 may be manufactured on a third growth substrate 101c, and then may be passed through the first to seventh units 100 to 700 of the manufacturing apparatus 1 of the display device to be transferred to the second bonding electrode BDE2 of the corresponding third pixel PXL3 of the TFT array substrate ARY.

Figure 19A:
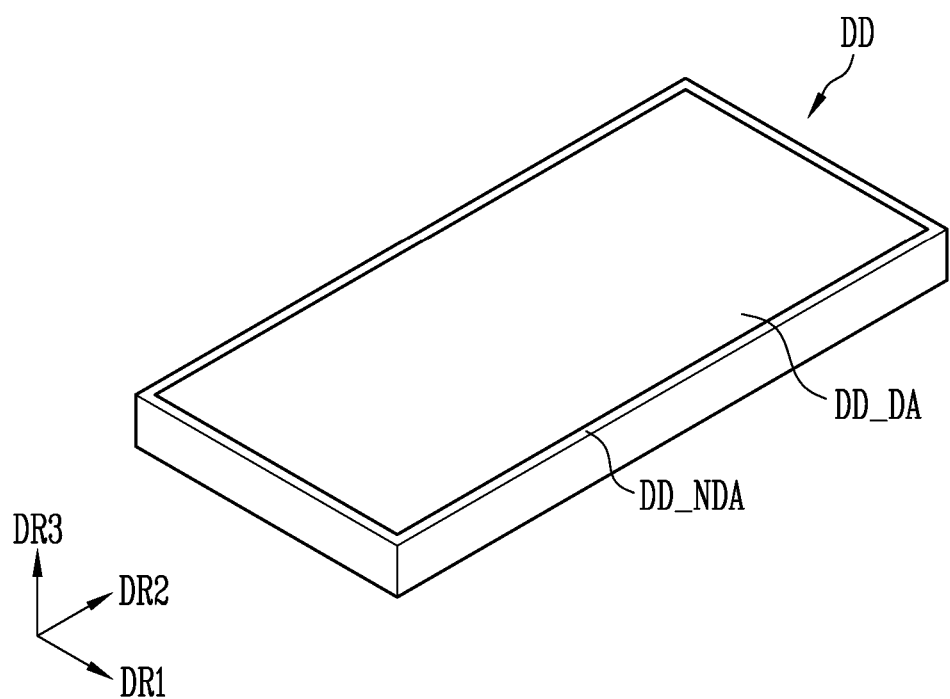
FIG. 19A illustrates a schematic perspective view of a finally completed display device by using the manufacturing apparatus of the display device shown in FIG. 1.
Figure 19B:
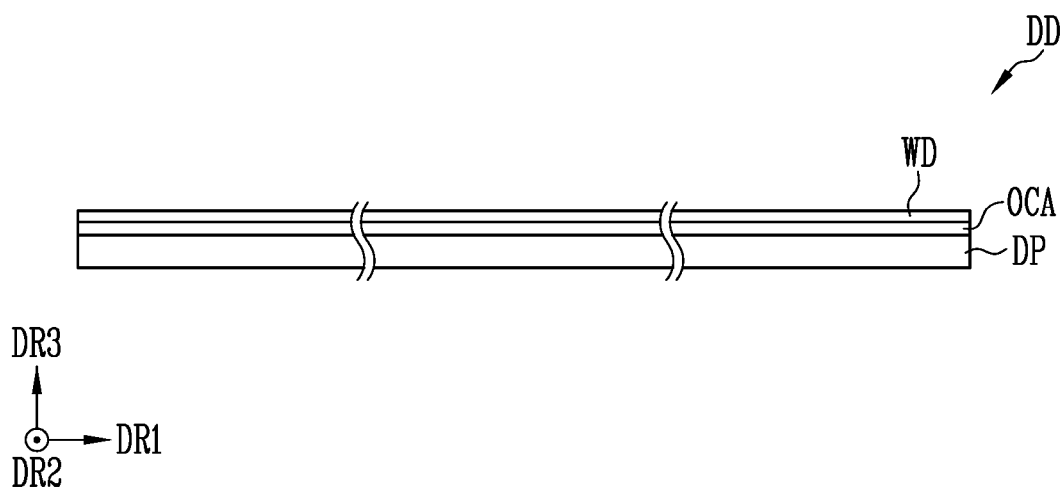
FIG. 19B illustrates a schematic cross-sectional view of the display device of FIG. 19A.
Figure 20:
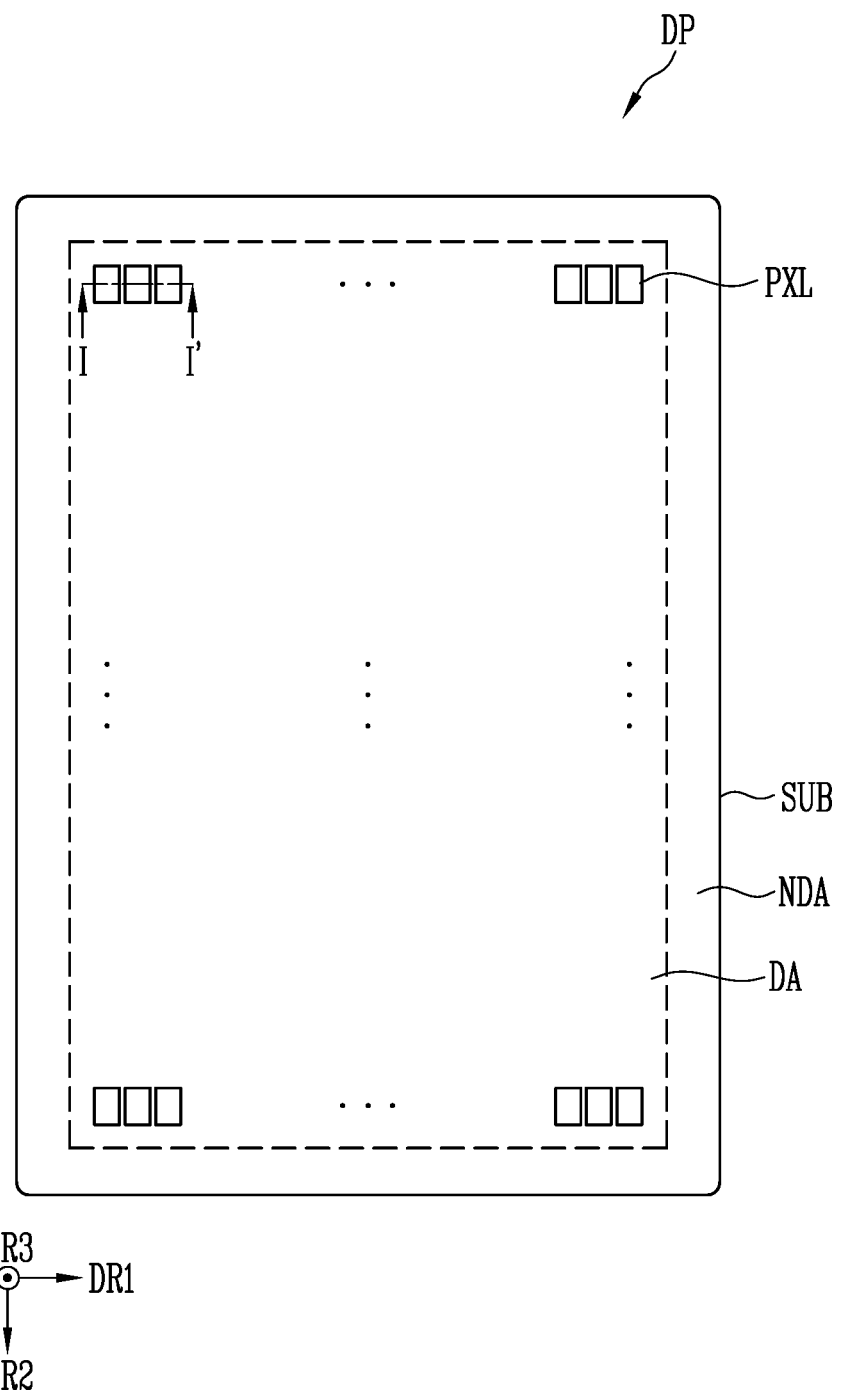
FIG. 20 illustrates a schematic top plan view of a display panel according to an embodiment of the present disclosure.
Figure 21:
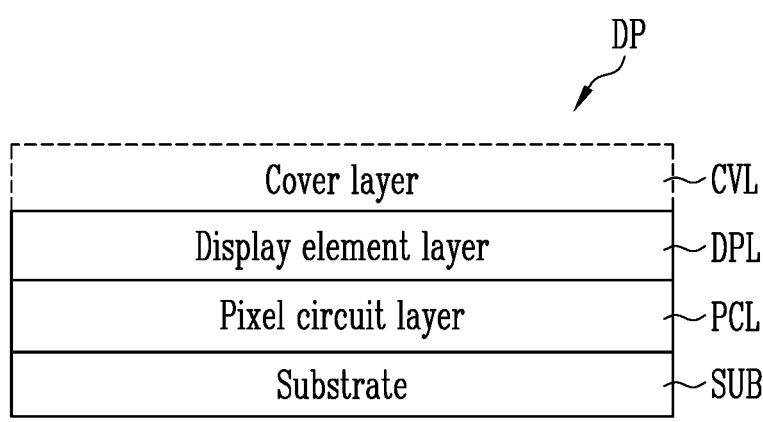
FIGS. 21-22 illustrate schematic cross-sectional views of a display panel according to one or more embodiments of the present disclosure.
Figure 22:
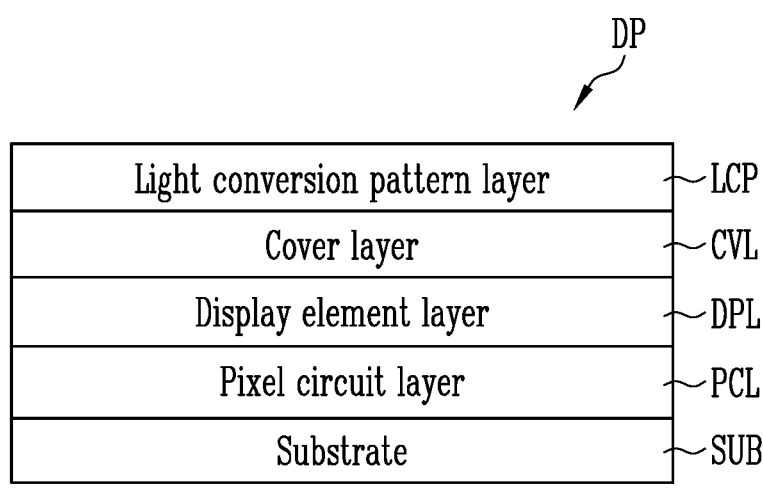

FIG. 19A illustrates a schematic perspective view of a finally completed display device DD by using the manufacturing apparatus of the display device shown in FIG. 1. FIG. 19B illustrates a schematic cross-sectional view of the display device DD of FIG. 19A. FIG. 20 illustrates a schematic top plan view of a display panel DP according to an embodiment of the present disclosure. FIG. 21 and FIG. 22 illustrate schematic cross-sectional views of a display panel DP according to one or more embodiments of the present disclosure.

Referring to FIG. 1 and FIG. 19A to FIG. 22, the display device DD may include the display panel DP and a window WD.

The display device DD may be provided in various suitable shapes, and as an example, may be provided in a rectangular plate shape having two pairs of sides, each of the pairs of sides including sides that are parallel to or substantially parallel to each other, but the present disclosure is not limited thereto. When the display device DD is provided in the rectangular plate shape, the sides of one pair of the two pairs of sides may be provided to be longer than the sides of the other pair of the two pairs of sides. In the drawings, the display device DD is shown to have an angled corner formed of a straight line, but the present disclosure is not limited thereto. In some embodiments, the display device DD provided in a shape of a rectangular plate may have a corner portion at which one long side and one short side contact each other having a rounded or curved shape.

In an embodiment, for convenience of illustration, a case in which the display device DD has a rectangular shape having a pair of long sides and a pair of short sides is illustrated, and an extending direction of the long sides is indicated as a second direction DR2, an extending direction of the short sides is indicated as a first direction DR1, and a thickness direction of the display device DD is indicated as a third direction DR3. The first to third directions DR1, DR2, and DR3 may refer to different directions indicated by the first to third directions DR1, DR2, and DR3, respectively.

In an embodiment, at least a portion of the display device DD may have flexibility, and the display device DD may be folded at the portion having the flexibility. The display device DD may include a display area DD_DA for displaying an image, and a non-display area DD_NDA provided at (e.g., in or on) at least one side of the display area DD_DA. The non-display area DD_NDA is an area in which an image is not displayed. In some embodiments, a shape of the display area DD_DA and a shape of the non-display area DD_NDA may be correspondingly designed.

In some embodiments, the display device DD may include a sensing area and a non-sensing area. The display device DD may display an image through the sensing area, and may also detect a touch input made on a display surface (or an input surface) or may detect light incident from the front. The non-sensing area may surround (e.g., around a periphery of) the sensing area, but the present disclosure is not limited thereto. In some embodiments, a partial area of the display area DD_DA may correspond to the sensing area.

The display panel DP may display an image. As an example of the display panel DP, a self-emission display panel, for example, such as an organic light emitting display panel (OLED panel) using an organic light emitting diode as a light emitting element, a nano-scale LED display panel using an ultra small light emitting diode as a light emitting element, or a quantum dot organic light emitting display panel (QD OLED panel) using a quantum dot and an organic light emitting diode, may be used. However, the present disclosure is not limited thereto, and as another example of the display panel DP, a non-emission display panel, for example, such as a liquid crystal display panel (LCD panel), an electro-phoretic display panel (EPD panel), or an electro-wetting display panel (EWD panel), may be used. When the non-emission display panel is used as the display panel DP, the display device DD may be provided with a separate light source (for example, such as a backlight or a backlight unit) that supplies light to the display panel DP.

The display panel DP may include the substrate SUB and the plurality of pixels PXL provided on the substrate SUB.

The substrate SUB may be formed of one area having an approximately rectangular shape. However, the number of areas provided in the substrate SUB may be different from the above-described example, and the shape of the substrate SUB may have a different shape depending on the area provided in the substrate SUB.

The substrate SUB may include (e.g., may be made of) an insulating material, for example, such as glass or a resin. In addition, the substrate SUB may include (e.g., may be made of) a flexible material to be bendable and/or foldable, and may have a single-layer structure or a multi-layered structure. For example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material included in the substrate SUB is not limited to the above-described examples.

The substrate SUB may include a display area DA and a non-display area NDA. The display area DA may be an area at (e.g., in or on) which the pixels PXL are provided to display an image, and the non-display area NDA may be an area in which the pixels PXL are not provided and no image is displayed.

The display area DA of the substrate SUB (or display panel DP) corresponds to the display area DD_DA of the display device DD, and the non-display area NDA of the substrate SUB (or display panel DP) may correspond to the non-display area DD_NDA of the display device DD. The non-display area NDA may correspond to a bezel area of the display device DD.

The non-display area NDA may be provided at (e.g., in or on) at least one side of the display area DA. The non-display area NDA may surround (e.g., around a periphery of) a circumference (or edge) of the display area DA. The non-display area NDA may be provided with a portion of a wire part connected to the pixels PXL, and a driver that is connected to the portion of the wire part to drive the pixels PXL.

The portion of the wire part may electrically connect the driver to the pixels PXL. The portion of the wire part provides a signal to each of the pixels PXL, and may include (e.g., may be) signal lines connected to the pixels PXL, for example, such as a fan-out line connected to a scan line, a data line, and/or the like.

The pixels PXL may be provided at (e.g., in or on) the display area DA of the substrate SUB. Each of the pixels PXL may be a minimum unit that displays an image. The pixels PXL may include light emitting elements that emit white light and/or colored light. Each of the pixels PXL may emit one color from among red, green, and blue, but the present disclosure is not limited thereto, and may emit any suitable color, for example, such as cyan, magenta, or yellow.

The pixels PXL may be arranged in a matrix form along a row extending in the first direction DR1, and along a column extending in the second direction DR2 crossing the first direction DR1. However, the arrangement form of the pixels PXL is not particularly limited thereto, and the pixels PXL may be arranged in various suitable forms. In the drawings, the pixels PXL are shown to have a rectangular shape, but the present disclosure is not limited thereto, and the pixels PXL may be provided in various suitable shapes. In addition, when a plurality of pixels PXL are provided, the pixels PXL may be provided to have different areas (or sizes) from one another. For example, in the case in which the pixels PXL emit different colors of light, the pixels PXL that emit the same color of light as each other may be provided to have a different area (or size) or a different shape from those of the other pixels.

The driver may provide a signal (e.g., a predetermined signal) and a power source (e.g., a predetermined power source) to each pixel PXL through the wire part, thereby controlling driving of the pixels PXL.

The display panel DP, as shown in FIG. 21, may include a pixel circuit layer PCL, a display element layer DPL, and a cover layer CVL that are sequentially positioned on the substrate SUB.

The pixel circuit layer PCL is provided on the substrate SUB, and may include a plurality of transistors, signal lines connected to the transistor, and power lines (e.g., predetermined power lines). For example, each transistor may have a structure in which a semiconductor layer, a gate electrode, a first terminal, and a second terminal are sequentially stacked with an insulating layer interposed therebetween. The semiconductor layer may include an amorphous silicon, a poly silicon, a low temperature poly silicon, and/or an organic semiconductor. The gate electrode, the first terminal, and the second terminal may include one of aluminum (Al), copper (Cu), titanium (Ti), and/or molybdenum (Mo), but the present disclosure is not limited thereto. In addition, the pixel circuit layer PCL may include at least one or more of various suitable insulation layers.

The display element layer DPL may be disposed on the pixel circuit layer PCL. The display element layer DPL may include a light emitting element LD that emits light. The light emitting element LD may have the same or substantially the same structure as that of one of the light emitting elements LD described above with reference to FIG. 1 to FIG. 18.

The cover layer CVL may be selectively disposed on the display element layer DPL. The cover layer CVL may include (e.g., may be) an encapsulation substrate or a multi-layered encapsulation film. When the cover layer CVL is in a form of the encapsulation film, it may include an inorganic film and/or an organic film. For example, the cover layer CVL may have a structure in which an inorganic film, an organic film, and an inorganic film are sequentially stacked. The cover layer CVL may prevent or substantially prevent external air and moisture from penetrating into the display element layer DPL and the pixel circuit layer PCL.

In some embodiments, as shown in FIG. 22, a light conversion pattern layer LCP may be selectively disposed on the cover layer CVL. The light conversion pattern layer LCP may use quantum dots to change a wavelength (or a color) of light emitted from the display element layer DPL, and may use a color filter to selectively transmit light of a specific wavelength (or a specific color). The light conversion pattern layer LCP will be described in more detail below with reference to FIG. 25 and FIG. 26.

A window WD for protecting an exposed surface of the display panel DP may be provided on the display panel DP. The window WD may protect the display panel DP from an external impact, and may provide an input surface and/or a display surface to a user. The window WD may be combined with (e.g., may be attached to) the display panel DP by using an optically clear adhesive (OCA).

The window WD may have a multi-layered structure selected from a glass substrate, a plastic film, and/or a plastic substrate. Such a multi-layered structure may be formed through a continuous process or an adhesive process using an adhesive layer. The window WD may be entirely or partially flexible.

A touch sensor (or an input sensing layer) may be disposed between the display panel DP and the window WD. The touch sensor may be directly disposed on a surface of the display panel DP on which an image is displayed to receive a user's touch input.

Figure 23:
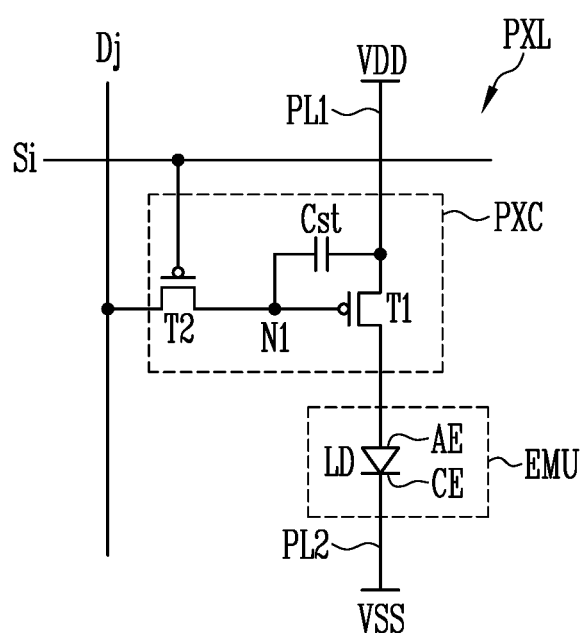
FIG. 23 illustrates a circuit diagram of an electrical connection relationship between constituent elements included in each pixel shown in FIG. 20 according to an embodiment.

FIG. 23 illustrates a circuit diagram of an electrical connection relationship between constituent elements included in each pixel PXL shown in FIG. 20 according to an embodiment.

For example, FIG. 23 illustrates to an electrical connection relationship between the constituent elements included in a pixel PXL applicable to an active matrix type of display device according to an embodiment. However, the types of constituent elements included in the pixel PXL according to embodiments of the present disclosure are not limited thereto.

In FIG. 23, the constituent elements included in the pixel PXL illustrated in FIG. 20 as well as the area in which the constituent elements are provided are comprehensively referred to as the pixel PXL. The pixel PXL shown in FIG. 23 may be one of the pixels PXL provided at (e.g., in or on) the display panel DP of FIG. 20 (or the display device DD of FIG. 19A and FIG. 19B), and the pixels PXL may have the same or substantially the same (or similar) structure as each other.

Referring to FIG. 1 to FIG. 23, the pixel PXL may include a light emitting unit (EMU) (e.g., a light emitting portion or a light emitting device) that generates light having a luminance corresponding to a data signal. In addition, the pixel PXL may further selectively include a pixel circuit PXC for driving the light emitting unit EMU.

In some embodiments, the light emitting unit EMU may include the light emitting element LD connected between the first power line PL1 to which a voltage of the first driving power source VDD is applied, and the second power line PL2 to which a voltage of the second driving power source VSS is applied. For example, the light emitting unit EMU may include the light emitting element LD connected between the first electrode AE and the second electrode CE. In an embodiment, the first electrode AE may be an anode, and the second electrode CE may be a cathode.

The light emitting element LD included in the light emitting unit EMU may include a first end portion connected to the first driving power source VDD through the first electrode AE, and a second end portion connected to the second driving power source VSS through the second electrode CE. The first driving power source VDD and the second driving power source VSS may have different potentials from each other. For example, the first driving power source VDD may be set as a high potential power source, and the second driving power source VSS may be set as a low potential power source. In this case, a potential difference between the first and second driving power sources VDD and VSS may be set to be equal to or higher than a threshold voltage of the light emitting element LD during a light emitting period of the pixel PXL.

As described above, the light emitting element LD connected between the first electrode AE and the second electrode CE to which voltages of different potentials are respectively supplied may configure an effective light source, and may implement the light emitting unit EMU of each pixel PXL.

The light emitting element LD may emit light having a luminance corresponding to a driving current supplied through the pixel circuit PXC. For example, during each frame period, the pixel circuit PXC may supply a driving current corresponding to a gray value of corresponding frame data to the light emitting unit EMU. The driving current supplied to the light emitting unit EMU may flow in the light emitting element LD. Accordingly, when the light emitting element LD emits light having a luminance corresponding to the driving current, the light emitting unit EMU may emit light.

The pixel circuit PXC may be connected to a scan line Si and a data line Dj of the pixel PXL. For example, when the pixel PXL is disposed in an i-th (i is a natural number) row and a j-th (j is a natural number) column of the display area DA of the display panel DP (or substrate SUB), the pixel circuit PXC of the pixel PXL may be connected to an i-th scan line Si and a j-th data line Dj of the display area DA. In some embodiments, the pixel circuit PXC may include first and second transistors T1 and T2, and a storage capacitor Cst. However, the structure of the pixel circuit PXC is not limited to that of the embodiment shown in FIG. 23.

The first transistor T1 may be a driving transistor for controlling a driving current applied to the light emitting unit EMU, and may be connected between the light emitting unit EMU and the first driving power source VDD. In more detail, a first terminal of the first transistor T1 may be connected (or coupled) to the light emitting unit EMU, a second terminal of the first transistor T1 may be connected to the first driving power source VDD through a first power line PL1, and a gate electrode of the first transistor T1 may be connected (or coupled) to a first node N1. The first transistor T1 may control an amount of the driving current flowing from the first driving power source VDD to the light emitting unit EMU according to a voltage connected to the first node N1.

The second transistor T2 may be a switching transistor that selects the pixel PXL in response to a scan signal applied to the scan line Si to activate the pixel PXL, and may be connected between the data line Dj and the first node N1. A first terminal of the second transistor T2 may be connected (or coupled) to the data line Dj, a second terminal of the second transistor T2 may be connected (or coupled) to the first node N1, and a gate electrode of the second transistor T2 may be connected (or coupled) to the scan line Si. The first terminal and the second terminal of the second transistor T2 are different terminals, and for example, when the first terminal is a source electrode, the second terminal may be a drain electrode.

The second transistor T2 is turned on when a scan signal of a voltage (for example, a low voltage) capable of turning on the second transistor T2 is supplied from the scan line Si to electrically connect the data line Dj and the first node N1 to each other. In this case, a data signal of a corresponding frame is supplied to the data line Dj, and accordingly, the data signal is transmitted to the first node N1. The data signal transmitted to the first node N1 is charged in the storage capacitor Cst.

One electrode of the storage capacitor Cst may be connected (or coupled) to the first driving power supply VDD, and another electrode of the storage capacitor Cst may be connected (or coupled) to the first node N1. The storage capacitor Cst may charge a data voltage corresponding to the data signal supplied to the first node N1, and may maintain or substantially maintain the charged voltage until a data signal of a next frame is supplied.

FIG. 23 illustrates the pixel circuit PXC including the second transistor T2 for transmitting a data signal into the pixel PXL, the storage capacitor Cst for storing the data signal, and the first transistor T1 for supplying a driving current corresponding to the data signal to the light emitting element LD.

However, the present disclosure is not limited thereto, and the structure of the pixel circuit PXC may be variously modified as would be understood by those having ordinary skill in the art.

Figure 24:
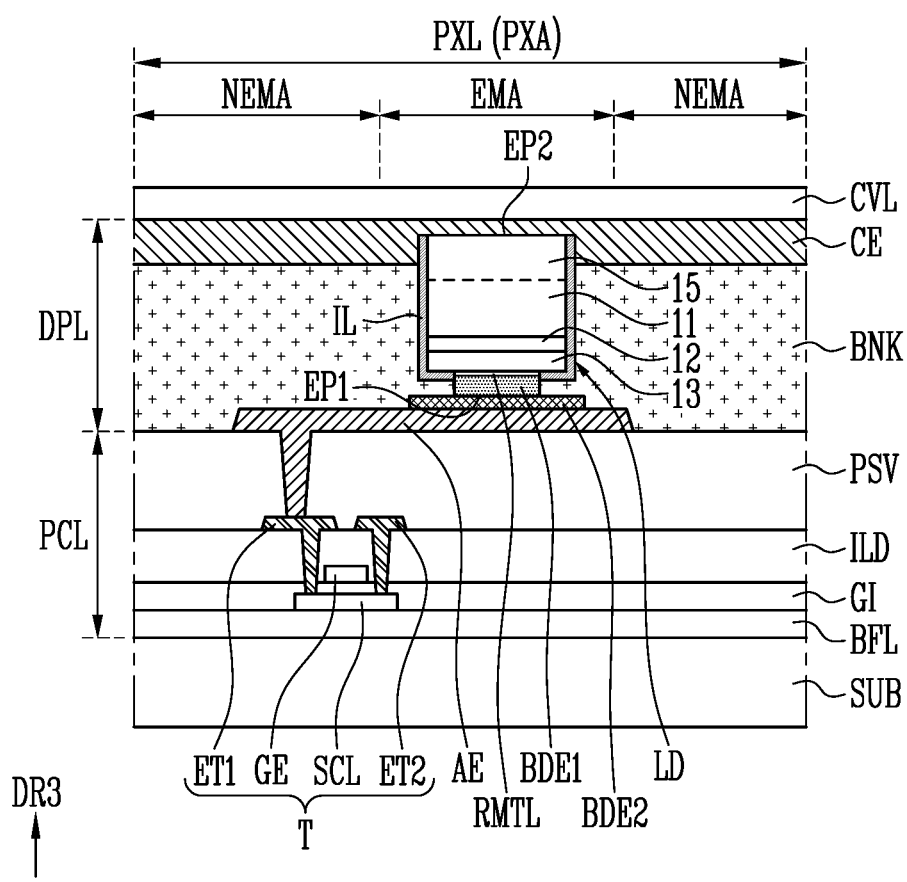
FIG. 24 schematically illustrates a schematic cross-sectional view of a connection structure between a transistor (for example, a first transistor) and a light emitting element of a pixel shown in FIG. 23.

FIG. 24 schematically illustrates a schematic cross-sectional view of a connection structure between the transistor T (for example, the first transistor T1) and the light emitting element LD (e.g., the light emitting unit EMU) of the pixel PXL shown in FIG. 23.

In FIG. 24, for better comprehension and ease of illustration, a thickness direction of the substrate SUB in the cross-sectional view is indicated by the third direction DR3.

In addition, the term "connection" between two elements may comprehensively refer to both electrical and physical connections, but the present disclosure is not limited thereto.

Further, the phrase "formed and/or provided at (e.g., in or on) the same layer" may mean formed in the same process, and the phrase "formed and/or provided at (e.g., in or on) another layer" may mean formed in a different process, but the present disclosure is not limited thereto.

In FIG. 24, a simplified structure of one pixel PXL is illustrated for convenience, but the present disclosure is not limited thereto.

Referring to FIG. 1 to FIG. 18 and FIG. 24, each pixel PXL according to an embodiment may be provided and/or positioned at (e.g., in or on) a corresponding pixel area PXA provided on the substrate SUB. The pixel area PXA is an area of the display area DA, and may include an emission area EMA and a non-emission area NEMA.

As described above, the pixel PXL may include the substrate SUB, the pixel circuit layer PCL, and the display element layer DPL.

At least one or more insulating layers and at least one or more conductive layers may be disposed on the substrate SUB. The insulating layers may include, for example, a buffer layer BFL, a gate insulating layer GI, an interlayer insulating layer ILD, and a passivation layer PSV that are sequentially provided on the substrate SUB. The conductive layers may include one or more conductive layers positioned between the insulating layers.

Because the substrate SUB may correspond to the same or substantially the same configuration as that of the substrate SUB described above with reference to FIG. 20, redundant description thereof may not be repeated.

The pixel circuit layer PCL may include the buffer layer BFL, the pixel circuit PXC including the transistor T provided on the buffer layer BFL, and the passivation layer PSV.

The buffer layer BFL may be provided and/or formed on one surface of the substrate SUB. The buffer layer BFL may prevent or substantially prevent impurities from being diffused into the transistor T included in the pixel circuit PXC. The buffer layer BFL may include an inorganic insulating film including an inorganic material. The buffer layer BFL may include at least one of various suitable metal oxides, for example, such as a silicon nitride ($SiN_x$), a silicon oxide ($SiO_x$), a silicon oxynitride ($SiO_xN_y$), and/or an aluminum oxide ($AlO_x$). The buffer layer BFL may be provided as a single layer, but the present disclosure is not limited thereto, and the buffer layer BFL may be provided as a multilayer of at least double layers or more. When the buffer layer BFL is provided as multiple layers, respective layers thereof may include (e.g., may be made of) the same or substantially the same material as each other, or different materials from each other. However, the present disclosure is not limited thereto, and in some embodiments, the buffer layer BFL may be omitted depending on the material, a process condition, and the like of the substrate SUB.

The transistor T may include the driving transistor for controlling a driving current of the light emitting element LD, and the switching transistor electrically connected to the driving transistor. Here, the driving transistor may be the first transistor T1 described above with reference to FIG. 23, and the switching transistor may be the second transistor T2 described above with reference to FIG. 23. For convenience, FIG. 24 illustrates only the driving transistor T corresponding to the first transistor T1.

The driving transistor T may include a semiconductor pattern SCL, a gate electrode GE, a first terminal ET1, and a second terminal ET2. The first terminal ET1 may be one of a source electrode and a drain electrode, and the second terminal ET2 may be the other of the source electrode and the drain electrode. For example, the first terminal ET1 may be the source electrode, and the second terminal ET2 may be the drain electrode.

The semiconductor pattern SCL may be provided and/or formed on the buffer layer BFL. The semiconductor pattern SCL may include a first contact area that is in contact with the first terminal ET1, and a second contact area that is in contact with the second terminal ET2. An area between the first contact area and the second contact area may be a channel area. The channel area may overlap with the gate electrode GE of the transistor T. The semiconductor pattern SCL may be a semiconductor pattern including (e.g., made of) a poly silicon, an amorphous silicon, an oxide semiconductor, or the like. For example, the channel area, which is a semiconductor pattern that is not doped with impurities, may be an intrinsic semiconductor. The first contact area and the second contact area may be semiconductor patterns doped with impurities. As the impurities, for example, P-type impurities may be used, but the present disclosure is not limited thereto.

The gate insulating layer GI may be provided and/or formed on the semiconductor pattern SCL.

The gate insulating layer GI may be entirely provided on the semiconductor pattern SCL and the buffer layer BFL to cover the semiconductor pattern SCL and the buffer layer BFL. The gate insulating layer GI may be an inorganic insulating film including an inorganic material. For example, the gate insulating layer GI may include at least one of various suitable metal oxides, such as a silicon nitride ($SiN_x$), a silicon oxide ($SiO_x$), a silicon oxynitride ($SiO_xN_y$), and/or an aluminum oxide ($AlO_x$). However, the material of the gate insulating layer GI is not limited to the above-described materials. In some embodiments, the gate insulating layer GI may be formed as an organic insulating film including an organic material. The gate insulating layer GI may be provided as a single layer, but the present disclosure is not limited thereto, and in some embodiments, the gate insulating layer GI may be provided as a multilayer of at least double layers or more.

The gate electrode GE may be provided and/or formed on the gate insulating layer GI to correspond to the channel area of the semiconductor pattern SCL. The gate electrode GE may be positioned on the gate insulating layer GI to overlap with the channel area of the semiconductor pattern SCL. In an embodiment, the gate electrode GE may be formed to have a single layer structure of a single or a mixture selected from a group consisting of copper (Cu), molybdenum (Mo), tungsten (W), aluminum neodymium (AlNd), titanium (Ti), aluminum (Al), silver (Ag), and an alloy thereof. In another embodiment, in order to reduce a wire resistance, the gate electrode GE may be formed to have a double layer or a multilayered structure including molybdenum (Mo), titanium (Ti), copper (Cu), aluminum (Al), and/or silver (Ag), which are low-resistance materials.

The interlayer insulating layer ILD may be provided and/or formed on the gate electrode GE.

The interlayer insulating layer ILD may include the same material as that of the gate insulating layer GI, or may include one or more suitable materials selected from the materials illustrated above as example constituent materials of the gate insulating layer GI.

Each of the first terminal ET1 and the second terminal ET2 may be provided and/or formed on the interlayer insulation layer ILD, and may contact the first contact area or the second contact area of the semiconductor pattern SCL through a contact hole sequentially passing through (e.g., sequentially penetrating) the gate insulating layer GI and the interlayer insulation layer ILD. For example, the first terminal ET1 may contact the first contact area of the semiconductor pattern SCL, and the second terminal ET2 may contact the second contact area of the semiconductor pattern SCL. Each of the first and second terminals ET1 and ET2 may include the same material as that of the gate electrode GE, or may include one or more suitable materials selected from the materials illustrated above as example constituent materials of the gate electrode GE.

As described above, the first and second terminals ET1 and ET2 of the driving transistor T may be separate electrodes that contact the semiconductor pattern SCL through the contact hole sequentially penetrating the gate insulating layer GI and the interlayer insulating layer ILD to be electrically connected to the semiconductor pattern SCL, but the present disclosure is not limited thereto. In some embodiments, the first terminal ET1 of the driving transistor T may be a first contact area adjacent to one side of the channel area of the semiconductor pattern SCL, and the second terminal ET2 of the driving transistor T may be a second contact area adjacent to another side (e.g., an opposite side) of the channel area. In this case, the first terminal ET1 of the driving transistor T may be electrically connected to the light emitting element LD through a separate connecting member, for example such as a bridge electrode.

In an embodiment, the driving transistor T may be configured as a low temperature polysilicon thin film transistor, but the present disclosure is not limited thereto. In some embodiments, the driving transistor T may be configured as an oxide semiconductor thin film transistor. In addition, a case in which the driving transistor T is a thin film transistor having a top gate structure is described as an example, but the present disclosure is not limited thereto, and the structure of the driving transistor T may be variously modified as needed or desired.

Although not directly shown in FIG. 24, the pixel circuit layer PCL may further include various signal lines (for example, such as scan lines and data lines) and power lines (for example, such as first and second power lines) that are electrically connected to the driving transistor T. For example, the power lines may be the first and second power lines PL1 and PL2 described above with reference to FIG. 23. Each of the first and second power lines PL1 and PL2 may include a conductive material (or substance). For example, in some embodiments, each of the first and second power lines PL1 and PL2 may be formed to have a single layer (or single film) structure of a single or a mixture selected from the group consisting of copper (Cu), molybdenum (Mo), tungsten (W), aluminum neodymium (AlNd), titanium (Ti), aluminum (Al), silver (Ag), and an alloy thereof. As another example, in some embodiments, in order to reduce a wire resistance, each of the first and second power lines PL1 and PL2 may be formed to have a double layer (or double film) or a multilayered (or multifilm) structure including molybdenum (Mo), titanium (Ti), copper (Cu), aluminum (Al), and/or silver (Ag), which are low-resistance materials. For example, each of the first power line PL1 and the second power line PL2 may be formed of a double layer (or double film) stacked in the order of titanium (Ti)/copper (Cu).

The passivation layer PSV may be provided and/or formed on the driving transistor T.

The passivation layer PSV (also referred to as a "protective layer" or "via layer") may be an inorganic insulating film including an inorganic material, or an organic insulating film including an organic material. The inorganic insulating film may include, for example, at least one of various suitable metal oxides, such as a silicon oxide ($SiO_x$), a silicon nitride ($SiN_x$), a silicon oxynitride ($SiO_xN_y$), and/or an aluminum oxide ($AlO_x$). The organic insulation film may include, for example, at least one of a polyacrylates resin, an epoxy resin, a phenolic resin, a polyamides resin, a polyimides rein, an unsaturated polyesters resin, a poly-phenylene ethers resin, a poly-phenylene sulfides resin, and/or a benzocyclobutene resin.

In some embodiments, the passivation layer PSV may include the same material as that of the interlayer insulating layer ILD, but the present disclosure is not limited thereto. The passivation layer PSV may be provide as a single layer, but in some embodiments, may be provide as multilayers of at least double layers or more.

The passivation layer PSV may be partially opened to expose the first terminal ET1 of the driving transistor T to the outside. In other words, an opening or a contact hole may be formed in the passivation layer PSV to expose the first terminal ET1 of the driving transistor T.

The display element layer DPL may be provided and/or formed on the passivation layer PSV.

The display element layer DPL may include the first electrode AE, the second bonding electrode BDE2, the light emitting element LD, and the second electrode CE.

The first electrode AE may be provided and/or formed on the pixel circuit layer PCL. The first electrode AE is positioned under (e.g., underneath) the light emitting element LD, and may be electrically connected to the first end portion EP1 of the light emitting element LD. The second electrode CE is provided on the light emitting element LD, and may be electrically connected to the second end portion EP2 of the light emitting element LD. When viewed in a cross-sectional view, the first electrode AE and the second electrode CE may face each other in the third direction DR3 with the light emitting element LD interposed therebetween.

The first electrode AE may be electrically connected to the first terminal ET1 of the driving transistor T through a contact hole penetrating the passivation layer PSV. In an embodiment, the first electrode AE may be an anode. Because the first electrode AE is the same or substantially the same as the first electrode AE described above with reference to FIG. 1 to FIG. 16, redundant description thereof may not be repeated.

The second bonding electrode BDE2 may be positioned on the first electrode AE.

The second bonding electrode BDE2 may be a medium that is bonded to the first bonding electrode BDE1 of the light emitting element LD to electrically connect the first electrode AE that is electrically connected to the driving transistor T to the light emitting element LD. The second bonding electrode BDE2 may have the same or substantially the same configuration as that of the second bonding electrode BDE2 described above with reference to FIG. 1 to FIG. 16, and thus, redundant description thereof may not be repeated.

The light emitting element LD may be positioned on the second bonding electrode BDE2 on the first electrode AE. In an embodiment, each pixel PXL may include one light emitting element LD. In other words, one light emitting element LD may be provided as a light source of each pixel PXL.

The light emitting element LD may be realized as a vertical type of light emitting laminate in which the first bonding electrode BDE1, the reflective electrode RMTL, the second semiconductor layer 13, the active layer 12, the first semiconductor layer 11, and the auxiliary layer 15 are sequentially stacked along the third direction DR3. In this case, the first bonding electrode BDE1 may be positioned at the first end portion EP1 of the light emitting element LD, and the auxiliary layer 15 may be positioned at the second end portion EP2 of the light emitting element LD. In this case, the first bonding electrode BDE1 may directly contact the second bonding electrode BDE2 to bond with the second bonding electrode BDE2. The auxiliary layer 15 may directly contact the second electrode CE to be electrically connected to the second electrode CE.

The light emitting element LD may further include the insulating layer IL covering an external circumferential surface of the vertical type of light emitting laminate.

The light emitting element LD retransferred to the transfer substrate (for example, the second film 20) in the seventh unit 700 is moved to the upper portion of the second bonding electrode BDE2 to correspond to the emission area EMA of the pixel PXL by a conveyer, and then may be transferred onto the second bonding electrode BDE2 by the laser beam irradiated by the laser shot LSS.

A bonding method may be used to electrically connect the light emitting element LD and the first electrode AE.

As described above, the light emitting element LD may be transferred onto the second bonding electrode BDE2 to correspond to the emission area EMA of the pixel PXL to contact the first bonding electrode BDE1 and the second bonding electrode BDE2 of the light emitting element LD, and then the bonding process may be performed, so that the first bonding electrode BDE1 and the second bonding electrode BDE2 may be electrically connected to each other. Accordingly, the light emitting element LD and the first electrode AE may be electrically connected to each other.

The bank BNK may be entirely formed on the second bonding electrode BDE2 and the light emitting element LD.

The bank BNK may be positioned at (e.g., in or on) the non-emission area NEMA to configure a pixel defining film that partitions the emission areas EMA of the pixels PXL. The bank BNK may include at least one light blocking material and/or reflective material (or scattering material) to prevent or substantially prevent a defect in which light leaks between adjacent pixels PXL. In some embodiments, the bank BNK may be an organic insulating film including an organic material. For example, the bank BNK may be formed as an organic insulating film including (e.g., made of) an acrylic resin, an epoxy resin, a phenolic resin, a polyamide resin, a polyimide resin, or the like. In addition, in some embodiments, the bank BNK may include a transparent material. The transparent material may include, for example, a polyamides resin, a polyimide resin, and/or the like, but the present disclosure is not limited thereto. According to another embodiment, a reflective material layer may be separately provided and/or formed on the bank BNK to further improve an efficiency of light emitted from the pixel PXL.

In an embodiment, the bank BNK may expose the auxiliary layer 15 positioned at (e.g., in or on) the second end portion EP2 of the light emitting element LD.

The second electrode CE may be provided and/or formed on the light emitting element LD bonded to the first electrode AE.

The second electrode CE may be entirely formed on the second end portion EP2 of the light emitting element LD and the bank BNK. The second electrode CE may contact the second end portion EP2 of the light emitting element LD to be electrically connected to the second end portion EP2 of the light emitting element LD. For example, the second electrode CE may be electrically connected to the auxiliary layer 15 positioned at (e.g., in or on) the second end portion EP2 of the light emitting element LD.

The second electrode CE may be electrically connected to the second power line PL2. Accordingly, the voltage of the second driving power source VSS applied to the second power line PL2 may be transmitted to the second electrode CE. In an embodiment, the second electrode CE may be a cathode.

In some embodiments, the cover layer CVL may be provided and/or formed on the second electrode CE.

The cover layer CVL may be an encapsulation substrate or an encapsulation layer including (e.g., made of) multiple layers. In this case, the cover layer CVL may prevent or substantially prevent external oxygen and moisture from being introduced into the display element layer DPL and the pixel circuit layer PCL. In some embodiments, the cover layer CVL may be a planarization layer that reduces a step caused by the constituent elements disposed under (e.g., underneath) the cover layer CVL.

Figure 25:
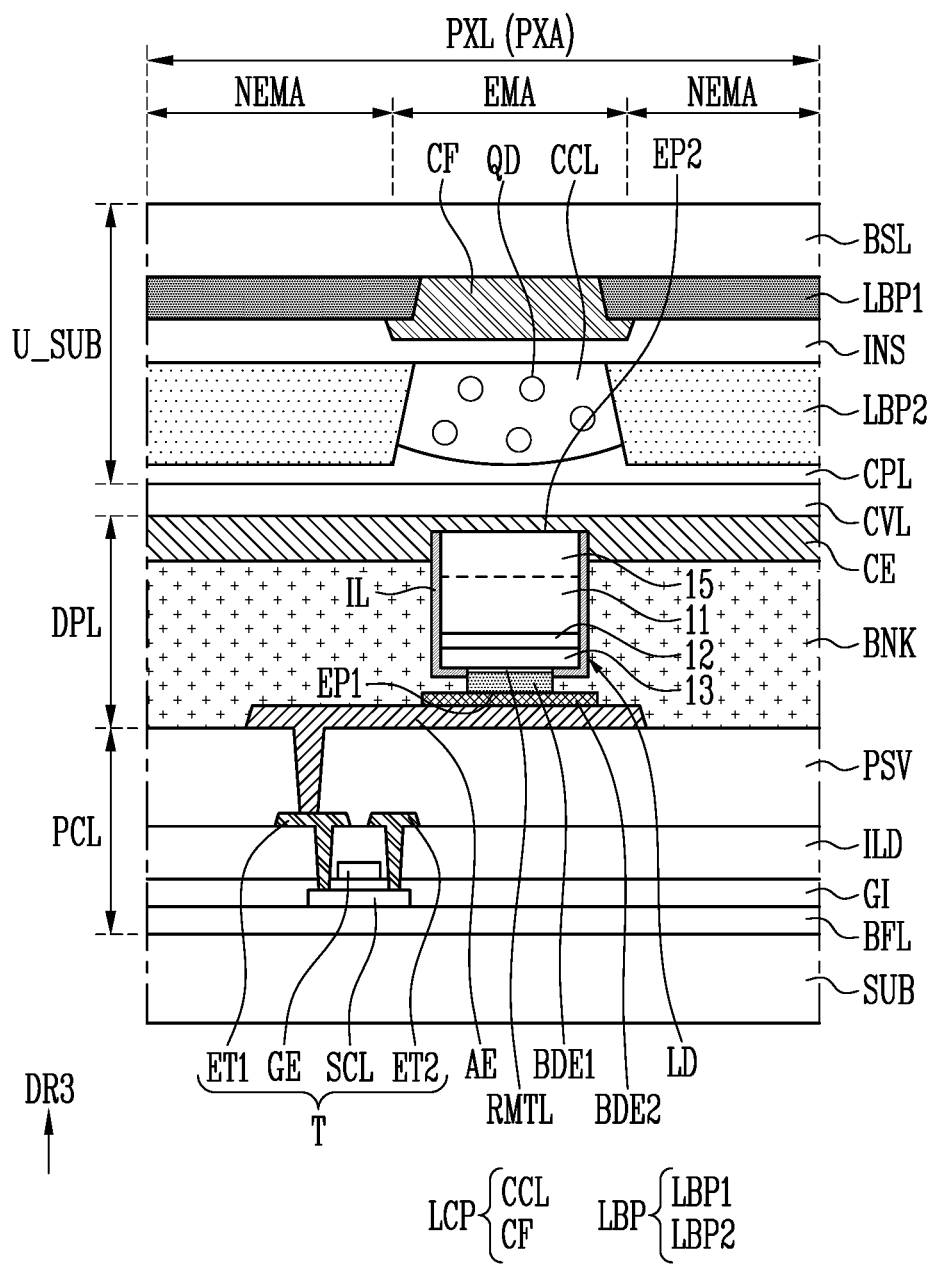
FIGS. 25-26 illustrate schematic cross-sectional views of a pixel according to one or more embodiments of the present disclosure.
Figure 26:
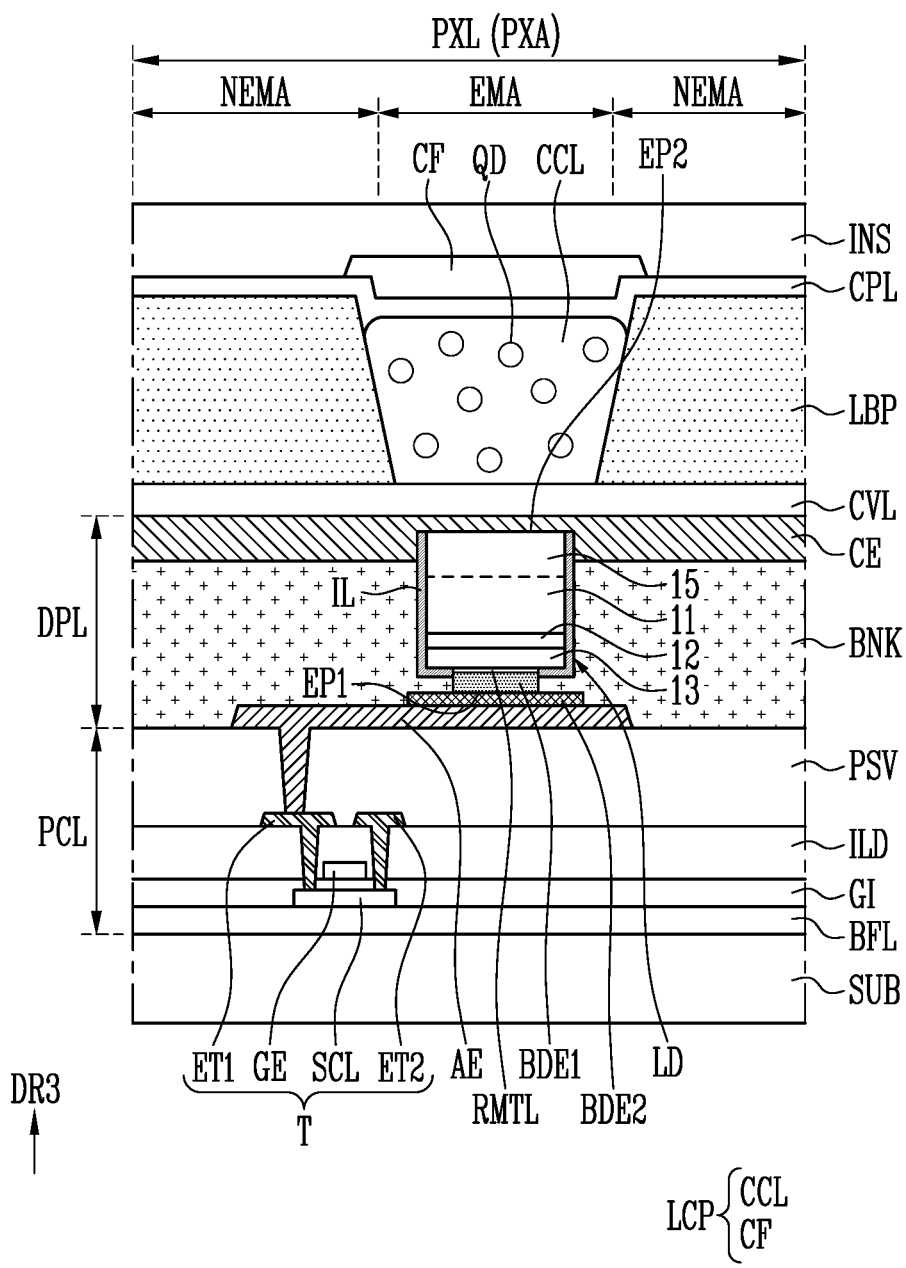

FIG. 25 and FIG. 26 illustrate schematic cross-sectional views of a pixel PXL according to one or more embodiments of the present disclosure.

The pixels PXL shown in FIG. 25 and FIG. 26, respectively, may be the same or substantially the same as (or similar to) the pixel PXL shown in FIG. 24, except that a light conversion pattern layer (LCP) may be further disposed on the display element layer DPL of the pixels PXL shown in FIGS. 25 and 26.

FIG. 25 and FIG. 26 illustrate different embodiments from each other with respect to a position of the light conversion pattern layer LCP. For example, FIG. 25 illustrates an embodiment in which an upper substrate U_SUB including the light conversion pattern layer LCP is positioned on the display element layer DPL through an adhesive process using an adhesive layer, and FIG. 26 illustrates an embodiment of forming the light conversion pattern layer LCP on the display element layer DPL through a continuous process.

Therefore, differences between the embodiments of FIGS. 25 and 26 and the above-described embodiments may be mainly described in more detail, and redundant description may not be repeated.

First, referring to FIG. 1 to FIG. 16, FIG. 24, and FIG. 25, the upper substrate U_SUB may be provided on the display element layer DPL of the pixel PXL.

The upper substrate U_SUB may be provided on the display element layer DPL to cover the pixel area PXA.

The upper substrate U_SUB may include a base layer BSL, the light conversion pattern layer LCP, and a light blocking pattern LBP.

The base layer BSL may be a rigid substrate or a flexible substrate, and the materials or physical properties of the base layer BSL are not particularly limited. The base layer BSL may include (e.g., may be made of) the same material as that of the substrate SUB, or may include (e.g., may be made of) a material different from that of the substrate SUB.

The light conversion pattern layer LCP may be disposed on one surface of the base layer BSL to correspond to the emission area EMA of the pixel PXL. The light conversion pattern layer LCP may include a color conversion layer CCL, and a color filter CF corresponding to a suitable color (e.g., a predetermined color).

The color conversion layer CCL may include color conversion particles QD corresponding to a suitable color (e.g., a predetermined color). The color filter CF may selectively transmit light of a suitable color (e.g., a predetermined color).

The color conversion layer CCL is disposed on one surface of an insulating layer INS so as to face the light emitting element LD, and may include the color conversion particles QD to convert light emitted from the light emitting element LD into light of a specific color. For example, when the light emitting element LD emits blue-based light (hereinafter, referred to as "blue light"), the color conversion layer CCL may include the color conversion particles QD of a white quantum dot that converts blue light into white light. Here, the color conversion particles QD of the white quantum dot may include a red quantum dot and a green quantum dot to convert blue light of the light emitting element LD into white light. However, the configuration of the color conversion layer CCL is not limited to the above-described example.

The color filter CF is disposed on one surface of the base layer BSL to face the color conversion layer CCL, and may selectively transmit the white light converted in the color conversion layer CCL as red light, green light, or blue light. When the pixel PXL is a red pixel, the color filter CF may include a red color filter. When the pixel PXL is a green pixel, the color filter CF may include a green color filter. In addition, when the pixel PXL is a blue pixel, the color filter CF may include a blue color filter.

The light conversion pattern layer LCP including the color conversion layer CCL and the color filter CF may be positioned at (e.g., in or on) the emission area EMA of the pixel PXL to correspond to the light emitting element LD.

The insulating layer INS may be provided and/or formed between the color filter CF and the color conversion layer CCL.

The insulating layer INS may be positioned on the color filter CF to cover the color filter CF, thereby protecting the color filter CF. The insulating layer INS may be an inorganic insulating film including an inorganic material, or an organic insulating film including an organic material.

The light blocking pattern LBP may be positioned adjacent to the light conversion pattern layer LCP. In an embodiment, the light blocking pattern LBP may be disposed on one surface of the base layer BSL to correspond to the non-emission area NEMA of the pixel PXL. The light blocking pattern LBP may correspond to the bank BNK of the display element layer DPL.

The light blocking pattern LBP may include a first light blocking pattern LBP1 and a second light blocking pattern LBP2.

The first light blocking pattern LBP1 may be positioned on one surface of the base layer BSL, and may be positioned adjacent to the color filter CF. The first light blocking pattern LBP1 may include at least one black matrix material (for example, at least one light blocking material known to those skilled in the art) from among various suitable types of black matrix materials, and/or a color filter material of a specific color.

In some embodiments, the first light blocking pattern LBP1 may be provided in a multi-layered structure in which at least two or more color filters for selectively transmitting light of different colors from each other from among a red color filter, a green color filter, and a blue color filter overlap with each other. For example, the first light blocking pattern LBP1 may be provided to include a red color filter, a green color filter disposed on the red color filter and overlapping with the red color filter, and a blue color filter disposed on the green color filter and overlapping with the green color filter. In other words, the first light blocking pattern LBP1 may be provided to have a structure in which a red color filter, a green color filter, and a blue color filter are sequentially stacked. In this case, the red color filter, the green color filter, and the blue color filter may be used as the first light blocking pattern LBP1 for blocking light transmission in the non-emission area NEMA of the pixel area PXA.

The insulating layer INS may be provided and/or formed on the first light blocking pattern LBP1. The insulating layer INS may be entirely positioned on the first light blocking pattern LBP1 and the color filter CF.

The second light blocking pattern LBP2 may be provided and/or formed on one surface of the insulating layer INS, so as to correspond to the first light blocking pattern LBP1. The second light blocking pattern LBP2 may be a black matrix.

The first light blocking pattern LBP1 and the second light blocking pattern LBP2 may include the same material as each other. In an embodiment, the second light blocking pattern LBP2 may be a structure that finally defines the emission area EMA of the pixel PXL. For example, the second light blocking pattern LBP2 may include (e.g., may be) a dam structure that finally defines the emission area EMA to which the color conversion layer CCL may be supplied in a process of supplying the color conversion layer CCL including the color conversion particles QD.

The upper substrate U_SUB may be positioned on the cover layer CVL to be combined with (e.g., to be attached to) the display element layer DPL. In this case, the cover layer CVL may include a transparent adhesive layer for enhancing an adhesive force between the display element layer DPL and the upper substrate U_SUB.

In some embodiments, the upper substrate U_SUB, as shown in FIG. 25, may further include a capping layer CPL that is entirely formed on the color conversion layer CCL and the second light blocking pattern LBP2.

The capping layer CPL may include at least one of various suitable metal oxides, for example, such as a silicon nitride ($SiN_x$), a silicon oxide ($SiO_x$), a silicon oxynitride ($SiO_xN_y$), and/or an aluminum oxide ($AlO_x$). The capping layer CPL is positioned on the color conversion layer CCL to protect the color conversion layer CCL from external moisture, thereby further improving the reliability of the color conversion layer CCL.

As described above, the display device according to an embodiment of the present disclosure may improve light emission efficiency by disposing the light conversion pattern layer LCP on the light emitting element LD to emit light having excellent color reproducibility through the light conversion pattern layer LCP.

In some embodiments, when the light emitting element LD disposed on the pixel PXL is a red light emitting element that emits red-based light, the color conversion layer CCL may not be provided thereon. In some embodiments, when the light emitting element LD disposed on the pixel PXL is a green light emitting element that emits green-based light, the color conversion layer CCL may not be provided thereon. In some embodiments, when the light emitting element LD disposed on the pixel PXL is a blue light emitting element that emits blue-based light, the color conversion layer CCL may not be provided thereon.

As described above, the upper substrate U_SUB including the light conversion pattern layer LCP may be formed on the display element layer DPL, but the present disclosure is not limited thereto.

In some embodiments, the light conversion pattern layer LCP may be formed on one surface of the substrate SUB provided with the pixel PXL. In more detail, as shown in FIG. 26, the light conversion pattern layer LCP and the light blocking pattern LBP may be formed on the substrate SUB provided with the pixel PXL.

In this case, the light blocking pattern LBP and the light conversion pattern layer LCP may be formed on the substrate SUB provided with the pixel PXL to cover the light emitting element LD of the pixel PXL. In an embodiment, the light blocking pattern LBP and the light conversion pattern layer LCP may be provided and/or formed on the cover layer CVL. The light blocking pattern LBP may correspond to the non-emission area NEMA of the pixel PXL, and the light conversion pattern layer LCP may correspond to the emission area EMA of the pixel PXL.

The light blocking pattern LBP may include a light blocking material for preventing or substantially preventing light leakage defects in which light leaks between the adjacent pixels PXL. In this case, the light blocking pattern LBP may be a black matrix. The light blocking pattern LBP may prevent or substantially prevent a mixture of light respectively emitted from the adjacent pixels PXL. The light blocking pattern LBP may include (e.g., may be) a structure (e.g., a dam portion) that finally defines the emission area EMA to which the color conversion layer CCL may be supplied in the process of supplying the color conversion layer CCL to the pixel PXL.

The color conversion layer CCL may be supplied into the emission area EMA of the pixel PXL defined by the light blocking pattern LBP, and may convert light emitted from the light emitting element LD into a desired light (e.g., a predetermined light).

The capping layer CPL may be entirely provided and/or formed on the light blocking pattern LBP and the color conversion layer CCL.

The color filter CF may be positioned on one surface of the capping layer CPL to correspond to the color conversion layer CCL. The color filter CF may face the color conversion layer CCL with the capping layer CPL interposed therebetween. The color filter CF may configure the light conversion pattern layer LCP together with the color conversion layer CCL. The light conversion pattern layer LCP may be positioned at (e.g., in or on) the emission area EMA of the pixel PXL, and may correspond to the light emitting element LD.

Figure 27:
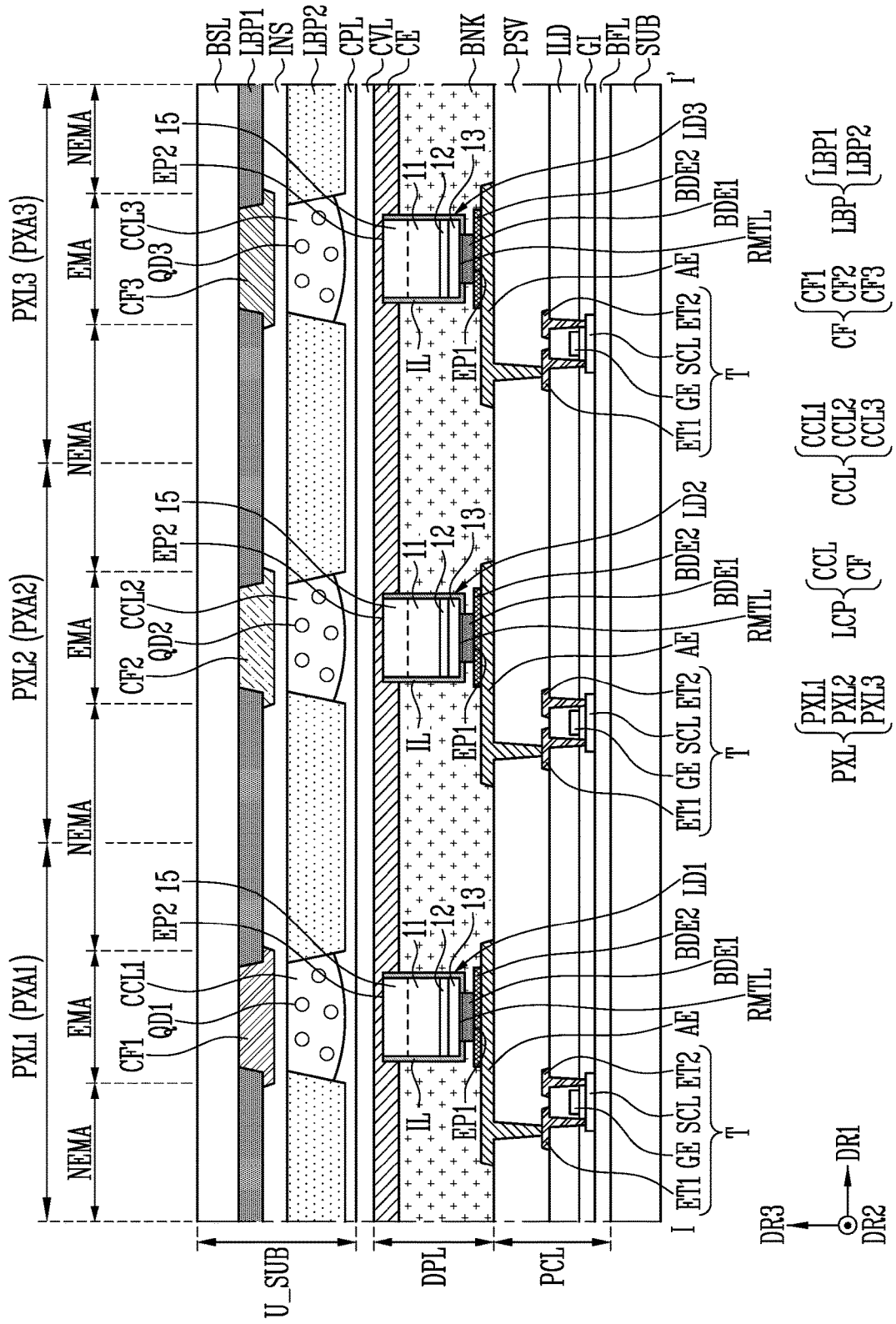
FIG. 27 illustrates a cross-sectional view taken along the line I-I' of FIG. 20.

FIG. 27 illustrates a cross-sectional view taken along the line I-I' of FIG. 20.

Hereinafter, the differences between the first to third pixels PXL1 to PXL3 shown in FIG. 27 from those of the embodiments described above may be mainly described in more detail, and redundant description thereof may not be repeated. In FIG. 27, the same reference numerals designate the same or substantially the same constituent elements as those of the embodiments described above, similar reference numerals designate similar constituent elements as those of the embodiments described above, and redundant description of the constituent elements may not be repeated.

In FIG. 27, for convenience of illustration, only a partial configuration of each of the first to third pixels PXL1 to PXL3 is shown.

Referring to FIG. 1, FIG. 20, and FIG. 27, the first pixel PXL1 (or a first sub-pixel), the second pixel PXL2 (or a second sub-pixel), and the third pixel PXL3 (or a third sub-pixel) may be arranged along the first direction DR1. Each of the first to third pixels PXL1, PXL2, and PXL3 may have the same or substantially the same configuration as that of the pixel PXL described above with reference to FIG. 24 or FIG. 25.

The display area DA of the substrate SUB may include a first pixel area PXA1 provided (or formed) with the first pixel PXL1, a second pixel area PXA2 provided (or formed) with the second pixel PXL2, and a third pixel area PXA3 provided (or formed) with the third pixel PXL3. In an embodiment, the first pixel PXL1 may be a red pixel, the second pixel PXL2 may be a green pixel, and the third pixel PXL3 may be a blue pixel. However, the present disclosure is not limited thereto, and in some embodiments, the second pixel PXL2 may be a red pixel, the first pixel PXL1 may be a green pixel, and the third pixel PXL3 may be a blue pixel. According to another embodiment, the third pixel PXL3 may be a red pixel, the first pixel PXL1 may be a green pixel, and the second pixel PXL2 may be a blue pixel.

Each of the first, second, and third pixels PXL1, PXL2, and PXL3 may include the emission area EMA. In addition, each of the first, second, and third pixels PXL1, PXL2, and PXL3 may include the non-emission area NEMA adjacent to the emission area EMA of the corresponding pixel PXL. The bank BNK (e.g., a partition wall) may be positioned at (e.g., in or on) the non-emission area NEMA.

Each of the first, second, and third pixels PXL1, PXL2, and PXL3 may include the substrate SUB, the pixel circuit layer PCL, and the display element layer DPL.

The display element layer DPL of the first pixel PXL1 may include the first electrode AE, the second bonding electrode BDE2, the bank BNK, the first light emitting element LD1, and the second electrode CE. Each of the bank BNK and the second electrode CE may be provided in common to the first, second, and third pixels PXL1, PXL2, and PXL3. For example, each of the bank BNK and the second electrode CE may be a common layer (e.g., a common film) provided to adjacent pixels PXL.

The second bonding electrode BDE2 may be bonded to the first bonding electrode BDE1 of the first light emitting element LD1 to electrically connect the first light emitting element LD1 and the first electrode AE to each other.

One first light emitting element LD1 may be transferred onto the second bonding electrode BDE2 of the first pixel PXL1 by a single laser shot in the seventh unit 700 of the manufacturing apparatus 1 of the display device. Accordingly, the one first light emitting element LD1 may be bonded to the first electrode AE of the first pixel PXL1. In an embodiment, the one first light emitting element LD1 may be provided to the first pixel PXL1.

The upper substrate U_SUB may be positioned on the display element layer DPL of the first pixel PXL1. The upper substrate U_SUB may include the light conversion pattern layer LCP, the light blocking pattern LBP, and the base layer BSL. The light conversion pattern layer LCP may include the first color filter CF1 positioned on one surface of the base layer BSL, and the first color conversion layer CCL1 positioned on the first color filter CF1 with the insulating layer INS interposed therebetween. Here, the first color conversion layer CCL1 may include the first color conversion particles QD1. The first color filter CF1 may be a red color filter. The above-described first color filter CF1 and first color conversion layer CCL1 may be positioned at (e.g., in or on) the emission area EMA of the first pixel PXL1.

The display element layer DPL of the second pixel PXL2 may include the first electrode AE, the second bonding electrode BDE2, the bank BNK, the second light emitting element LD2, and the second electrode CE.

The second bonding electrode BDE2 may be bonded to the first bonding electrode BDE1 of the second light emitting element LD2 to electrically connect the second light emitting element LD2 and the first electrode AE to each other.

One second light emitting element LD2 may be transferred onto the second bonding electrode BDE2 of the second pixel PXL2 by a single laser shot in the seventh unit 700 of the manufacturing apparatus 1 of the display device. Accordingly, the one second light emitting element LD2 may be bonded to the first electrode AE of the second pixel PXL2. In an embodiment, the one second light emitting element LD2 may be provided to the second pixel PXL2.

The upper substrate U_SUB may be positioned on the display element layer DPL of the second pixel PXL2. The upper substrate U_SUB may include the light conversion pattern layer LCP, the light blocking pattern LBP, and the base layer BSL. The light conversion pattern layer LCP may include the second color filter CF2 positioned on one surface of the base layer BSL, and the second color conversion layer CCL2 positioned on the second color filter CF2 with the insulating layer INS interposed therebetween. The second color conversion layer CCL2 may include the second color conversion particles QD2. The second color filter CF2 may be a green color filter. The above-described second color filter CF2 and second color conversion layer CCL2 may be positioned at (e.g., in or on) the emission area EMA of the second pixel PXL2.

The display element layer DPL of the third pixel PXL3 may include the first electrode AE, the second bonding electrode BDE2, the bank BNK, the third light emitting element LD3, and the second electrode CE.

The second bonding electrode BDE2 may be bonded to the first bonding electrode BDE1 of the third light emitting element LD3 to electrically connect the third light emitting element LD3 and the first electrode AE to each other.

One third light emitting element LD3 may be transferred onto the second bonding electrode BDE2 of the third pixel PXL3 by a single laser shot in the seventh unit 700 of the manufacturing apparatus 1 of the display device. Accordingly, the one third light emitting element LD3 may be bonded to the first electrode AE of the third pixel PXL3. In an embodiment, the one third light emitting element LD3 may be provided to the third pixel PXL3.

The upper substrate U_SUB may be positioned on the display element layer DPL of the third pixel PXL3. The upper substrate U_SUB may include the light conversion pattern layer LCP, the light blocking pattern LBP, and the base layer BSL. The light conversion pattern layer LCP may include the third color filter CF3 and the third color conversion layer CCL3. The third color conversion layer CCL3 may include the third color conversion particles QD3. The third color filter CF3 may be a blue color filter. The above-described third color filter CF3 and third color conversion layer CCL3 may be positioned at (e.g., in or on) the emission area EMA of the third pixel PXL3.

Figure 28:
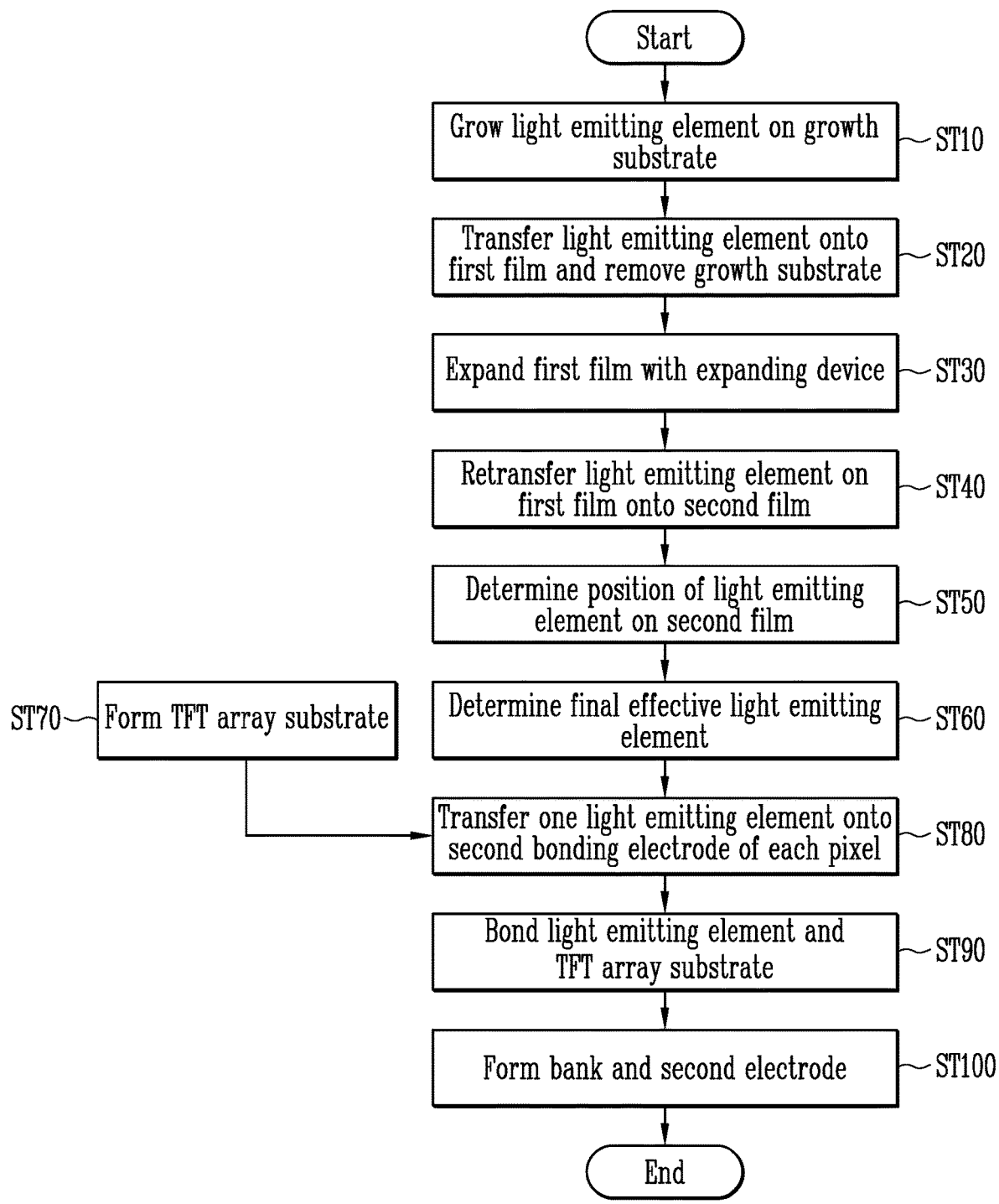
FIG. 28 illustrates a flowchart of a manufacturing method of a display device of FIG. 20.
Figure 29:
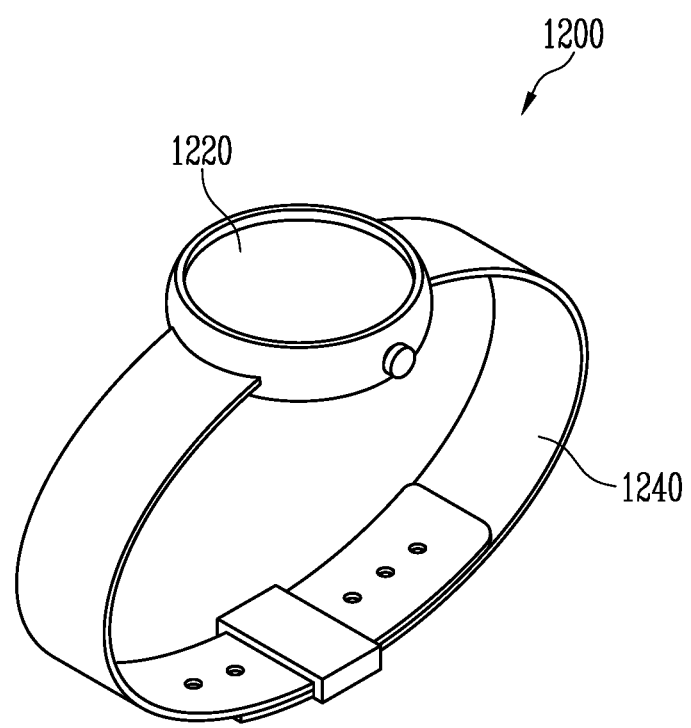
FIGS. 29-32 illustrate application examples of a display device according to embodiments of the present disclosure.
Figure 30:
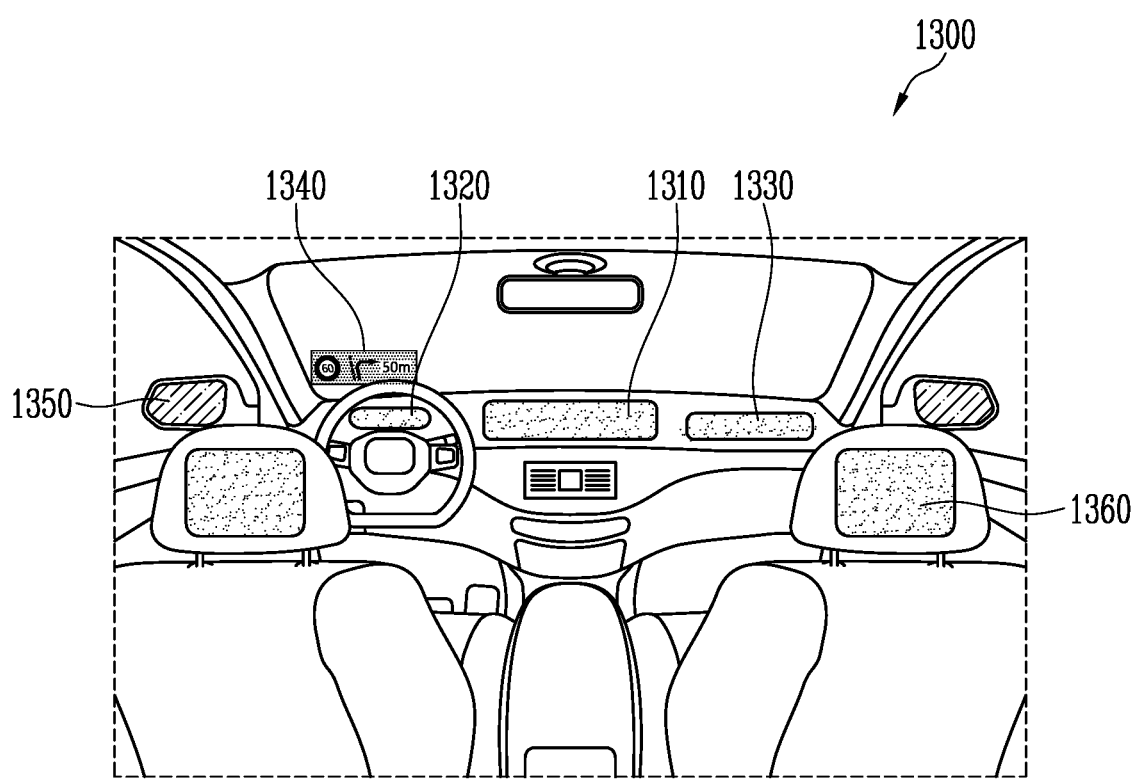

FIG. 28 illustrates a flowchart of a manufacturing method of the display device DD of FIG. 20.

Hereinafter, a manufacturing method of the display device DD according to an embodiment of the present disclosure will be schematically described with reference to FIG. 28 together with the embodiments described above with reference to FIG. 1 to FIG. 16, FIG. 20, and FIG. 24.

Referring to FIG. 1 to FIG. 3, FIG. 20, and FIG. 28, a plurality of light emitting elements LD is grown on the growth substrate 101 (ST10).

An etching process for the auxiliary layer 15, the first semiconductor layer 11, the active layer 12, and the second semiconductor layer 13 may be performed. In order to form the light emitting elements LD that are individually separated, a mask may be disposed on a light emitting laminate in which the auxiliary layer 15, the first semiconductor layer 11, the active layer 12, and the second semiconductor layer 13 are sequentially stacked, and then an etching process may be performed to be patterned at nanoscale to microscale intervals. The etching process may be performed in a direction from the second semiconductor layer 13 toward the auxiliary layer 15.

Afterwards, the growth substrate 101 on which the plurality of light emitting elements LD is grown may be conveyed to the first unit 100 by a loading unit.

Referring to FIG. 1 to FIG. 5, FIG. 20, and FIG. 28, after the first film 10 is disposed on the growth substrate 101, and the light emitting elements LD on the growth substrate 101 are transferred onto the first film 10, the growth substrate 101 is separated (e.g., is removed) (ST20), for example, by a suitable method such as a laser lift-off process or a chemical lift-off process.

The first film 10 onto which the light emitting elements LD that are separated from the growth substrate 101 are transferred may be conveyed to the second unit 200.

Referring to FIG. 1 to FIG. 8, FIG. 20, and FIG. 28, the first film 10 is expanded using the expanding device 50 (ST30), so that the light emitting elements LD on the first film 10 are spaced from adjacent light emitting elements LD, respectively, by the second distance D2.

The expanded first film 10 and the light emitting elements LD positioned thereon may be conveyed to the third unit 300.

Referring to FIG. 1 to FIG. 10, FIG. 20, and FIG. 28, after the second film 20 is disposed on the expanded first film 10, the light emitting elements LD on the first film 10 are retransferred onto the second film 20 (ST40).

Afterwards, the first film 10 is separated from the light emitting elements LD by using a physical method or the like. Subsequently, the light emitting elements LD retransferred onto the second film 20 may be conveyed to the fourth unit 400.

Referring to FIG. 1 to FIG. 11, FIG. 20, and FIG. 28, the positions of the light emitting elements LD on the second film 20 are determined (ST50), for example, by irradiating a guide laser over the light emitting elements LD retransferred onto the second film 20.

For example, the image sensor IMC may be disposed under the second film 20 to determine the positions of the light emitting elements LD according to whether or not light passing through the second film 20 is introduced.

Afterwards, the second film 20 may be conveyed to the fifth unit 500.

Referring to FIG. 1 to FIG. 12, FIG. 20, and FIG. 28, the final effective light emitting element LD is determined (ST60), for example, by binning the light emitting elements LD on the second film 20.

For example, the second film 20 including only the final effective light emitting element LD may be conveyed to the seventh unit 700.

Referring to FIG. 1, FIG. 20, FIG. 24, and FIG. 28, the TFT array substrate ARY is formed in the sixth unit 600 (ST70).

In an embodiment, the TFT array substrate ARY may include the substrate SUB, the pixel circuit layer PCL provided on the substrate SUB and including the driving transistor T, the first electrode AE electrically connected to the driving transistor T, and the second bonding electrode BDE2 positioned on first electrode AE.

Referring to FIG. 1 to FIG. 13, FIG. 20, FIG. 24, and FIG. 28, after the second film 20 is disposed on the TFT array substrate ARY, one light emitting element LD is transferred to the emission area EMA of a corresponding one pixel PXL (ST80), for example, by irradiating a laser beam to each light emitting element LD by using the laser shot LSS.

Referring to FIG. 1 to FIG. 14, FIG. 20, FIG. 24, and FIG. 28, the first bonding electrode BDE1 of the light emitting element LD and the second bonding electrode BDE2 of the TFT array substrate ARY are bonded to each other (ST90).

The second film 20 may be removed from the light emitting elements LD by using various suitable methods known to those skilled in the art.

Referring to FIG. 1 to FIG. 16, FIG. 20, FIG. 24, and FIG. 28, the second film 20 is removed, and the bank BNK and the second electrode CE are formed on the exposed light emitting elements LD (ST100).

The bank BNK may be formed on the light emitting elements LD, and may be partially removed by an etching process to expose the second end portion EP2 of each of the light emitting elements LD to the outside. The above-described etching process may be a dry etching process, but the present disclosure is not limited thereto.

The second electrode CE may be entirely formed on the bank BNK and the second end portion EP2 of each of the light emitting elements LD exposed to the outside by the bank BNK. The second electrode CE may contact the second end portion EP2 of each of the light emitting elements LD to be electrically connected thereto.

By the above-described process, one light emitting element LD is transferred to one pixel PXL at a time, so that the light emitting element LD and the first electrode AE of the one pixel PXL may be electrically connected to each other.

When the display device DD is a device in which a display surface is applied to at least one surface thereof, for example, such as a smart phone, a television, a tablet PC, a mobile phone, an image phone, an electron book reader, a desktop PC, a laptop PC, a netbook computer, a workstation, a server, a PDA, a portable multimedia player (PMP), an MP3 player, a medical device, a camera, or a wearable device, one or more embodiments of the present disclosure may be applied thereto.

Hereinafter, an application field of the display device DD according to one or more embodiments will be described with reference to FIG. 29 to FIG. 32.

FIG. 29 to FIG. 32 illustrate application examples of the display device according to embodiments of the present disclosure.

First, referring to FIG. 1, FIG. 19, FIG. 20, and FIG. 29, the display device DD may be applied to a smart watch 1200 including a display part 1220 and a strap part 1240.

The smart watch 1200 is a wearable electronic device, and may have a structure in which the strap part 1240 is mounted on a user's wrist. Here, the display device DD is applied to the display part 1220, so that image data including time information may be provided to the user.

Referring to FIG. 1, FIG. 19, FIG. 20, and FIG. 30, the display device DD may be applied to an automotive display 1300. Here, the automotive display 1300 may refer to an electronic device that is provided inside and outside a vehicle to provide image data.

For example, the display device DD may be applied to at least one of an infotainment panel 1310, a cluster 1320, a co-driver display 1330, a head-up display 1340, a side mirror display 1350, and/or a rear-seat display 1360, which are provided inside or outside the vehicle.

Referring to FIG. 1, FIG. 19, FIG. 20, and FIG. 31, the display device DD may be applied to smart glasses including a frame 170 and a lens part 171. The smart glasses is a wearable electronic device that may be worn on a user's face, and may have a structure in which a portion of the frame 170 is folded or unfolded. For example, the smart glasses may be a wearable device for augmented reality (AR).

The frame 170 may include a housing 170b for supporting the lens part 171, and a leg part 170a for a user to wear. The leg part 170a may be connected to (e.g., coupled to or attached to) the housing 170b by a hinge to be folded or unfolded.

A battery, a touch pad, a microphone, and a camera may be embedded in the frame 170. In addition, a projector that outputs light, a processor that controls an optical signal, and the like may be embedded in the frame 170.

The lens part 171 may be an optical member that transmits light or reflects light. The lens part 171 may include glass, a transparent synthetic resin, or the like.

Figure 31:
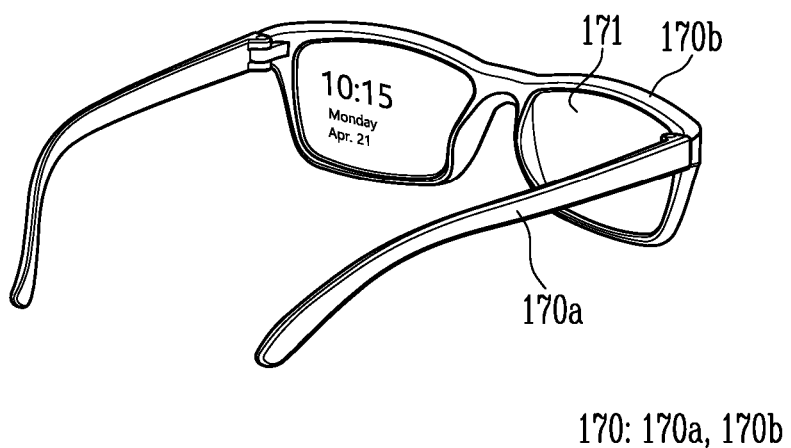

In addition, the lens part 171 may reflect an image by an optical signal transmitted from the projector of the frame 170 by a rear surface (for example, a surface of a direction directed to the user's eyes) of the lens part 171, so that it may be possible to allow the user's eyes to recognize the image. For example, the user may recognize information such as time and date displayed on the lens part 171 as shown in FIG. 31. In other words, the lens part 171 may be a type of display device, and the display device DD according to one or more embodiments may be applied to the lens part 171.

Referring to FIG. 1, FIG. 19, FIG. 20, and FIG. 32, the display device DD may be applied to a head-mounted display (HMD) including a head mounting band 180 and a display receiving case 181. The head mounted display is a wearable electronic device that may be worn on the user's head.

Figure 32:
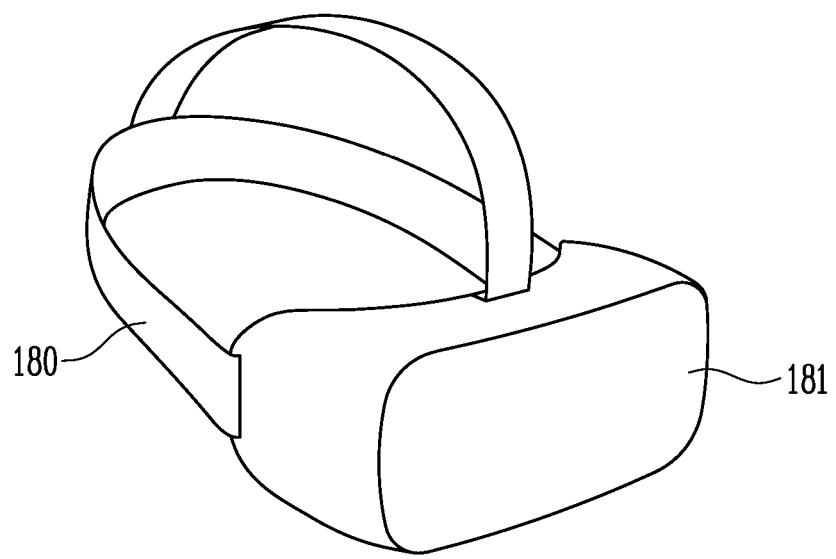

The head mounting band 180 is connected to the display receiving case 181 to fix the display receiving case 181. In FIG. 32, the head mounting band 180 is shown to surround (e.g., around a periphery of) an upper side of the user's head and both sides thereof, but the present disclosure is not limited thereto. The head mounting band 180 may be used for fixing the head mounted display to the user's head, and may be formed in a suitable form, for example, such as a spectacle frame or a helmet.

The display receiving case 181 accommodates the display device DD, and may include at least one lens. The at least one lens is a part that provides an image to the user. For example, the display device DD according to one or more embodiments may be applied to a left eye lens and a right eye lens implemented in the display receiving case 181.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A manufacturing apparatus of a display device, comprising:
    a first unit configured to transfer a plurality of light emitting elements on a growth substrate to a first film to be spaced from one another by a first distance;
    a second unit configured to expand the first film to space each of the plurality of light emitting elements on the first film from adjacent light emitting elements by a second distance greater than the first distance;
    a third unit configured to retransfer the plurality of light emitting elements to a second film;
    a fourth unit configured to determine positions of the plurality of light emitting elements by irradiating a guide laser beam to the plurality of light emitting elements on the second film;
    a fifth unit configured to bin the light emitting elements on the second film, and determine an effective light source from among the light emitting elements;
    a sixth unit configured to form a plurality of pixels on a substrate, each pixel comprising one or more transistors, a first electrode electrically connected to a transistor from among the one or more transistors, and a first bonding electrode on the first electrode;
    a seventh unit configured to remove the second film after transferring one light emitting element to the first bonding electrode of one pixel by irradiating a laser beam using a laser shot; and
    an eighth unit configured to form a second electrode on the one light emitting element.

2. The manufacturing apparatus of claim 1, wherein each of the plurality of light emitting elements comprises a first end portion and a second end portion in a length direction,
    the first end portion is configured to contact the first bonding electrode on the first electrode to be electrically connected to the first electrode, and
    the second end portion is configured to contact the second electrode to be electrically connected to the second electrode.

3. The manufacturing apparatus of claim 2, wherein each of the plurality of light emitting elements comprises:
    a second bonding electrode located at the first end portion, and configured to contact the first bonding electrode to be electrically connected to the first bonding electrode;
    an auxiliary layer located at the second end portion, and configured to contact the second electrode to be electrically connected to the second electrode;
    a second semiconductor layer located on the second bonding electrode;
    a first semiconductor layer located between the auxiliary layer and the second semiconductor layer; and
    an active layer located between the first semiconductor layer and the second semiconductor layer, and
    wherein the first semiconductor layer is an N-type semiconductor layer doped with an N-type dopant, and the second semiconductor layer is a P-type semiconductor layer doped with a P-type dopant.

4. The manufacturing apparatus of claim 3, wherein:
    the first end portion of each of the light emitting elements contacts the first film in the first unit; and
    the first unit is configured to separate the second end portion of each of the light emitting elements from the growth substrate to be exposed.

5. The manufacturing apparatus of claim 3, wherein the second distance is 10 μm or more, and is larger than a size of the laser shot.

6. The manufacturing apparatus of claim 4, wherein:
    the first film includes an expandable material, and comprises a first bonding layer, and a first base substrate on the first bonding layer;
    the first bonding layer contacts the second end portion of each of the light emitting elements, and includes a material having an adhesiveness; and
    the first base substrate supports the light emitting elements contacting the first bonding layer, and includes at least one of polyolefine, polyvinyl chloride (PVC), elastomeric silicone, elastomeric polyurethane, or elastomeric polyisoprene.

7. The manufacturing apparatus of claim 6, wherein the first film is expanded so that a density of the plurality of light emitting elements corresponds to that of the first bonding electrodes of the pixels.

8. The manufacturing apparatus of claim 4, wherein the fourth unit comprises an image sensor, and
wherein the fourth unit is configured to determine the positions of the light emitting elements depending on whether the guide laser beam irradiated to the light emitting elements and the second film flows to the image sensor.

9. The manufacturing apparatus of claim 8, wherein:
each of the light emitting elements further comprises a reflective electrode between the second semiconductor layer and the second bonding electrode; and
the reflective electrode is configured to reflect the guide laser beam irradiated to the light emitting elements to prevent the guide laser beam from passing through the second film on which the light emitting elements are located.

10. The manufacturing apparatus of claim 4, wherein the first unit is configured to separate the growth substrate from the plurality of light emitting elements using a laser lift-off method or chemical lift-off method to expose the second end portion of each of the light emitting elements.

11. The manufacturing apparatus of claim 10, wherein:
the second film is located at an upper portion of the exposed second end portion of each of the light emitting elements in the third unit; and
the third unit is configured to retransfer the light emitting elements to the second film so that the second end portion of each of the light emitting elements contacts the second film.

12. The manufacturing apparatus of claim 8, wherein the seventh unit is configured to bond the first bonding electrode of the one pixel and the second bonding electrode of the one light emitting element to each other.

13. The manufacturing apparatus of claim 12, wherein:
the second end portion of the one light emitting element is exposed in the eighth unit; and
the eighth unit is configured to form a bank covering a portion of the one light emitting element, and form the second electrode on the bank.

14. The manufacturing apparatus of claim 13, wherein the seventh unit is configured to transfer the one light emitting element to the first bonding electrode of the one pixel by one laser shot.

15. The manufacturing apparatus of claim 14, wherein the growth substrate comprises:
a first growth substrate on which one or more first light emitting elements are grown, the first light emitting elements being configured to emit red light;
a second growth substrate on which one or more second light emitting elements are grown, the second light emitting elements being configured to emit green light; and
a third growth substrate on which one or more third light emitting elements are grown, the third light emitting elements being configured to emit blue light.

16. The manufacturing apparatus of claim 15, wherein:
a first light emitting element from among the one or more first light emitting elements is transferred to the first bonding electrode of a first pixel from among the plurality of pixels through the first to seventh units;
a second light emitting element from among the one or more second light emitting elements is transferred to the first bonding electrode of a second pixel from among the plurality of pixels through the first to seventh units; and
a third light emitting element from among the one or more third light emitting elements is transferred to the first bonding electrode of a third pixel from among the plurality of pixels through the first to seventh units.

17. The manufacturing apparatus of claim 3, wherein:
each of the plurality of pixels includes an emission area in which one light emitting element is to be located, and a non-emission area adjacent to the emission area;
the eighth unit is configured to form an upper substrate on the second electrode of each of the pixels; and
the upper substrate comprises:
a light conversion pattern layer located at an upper portion of the second electrode to correspond to the emission area of a corresponding pixel from among the plurality of pixels; and
a light blocking pattern located at an upper portion of the second electrode to correspond to the non-emission area of the corresponding pixel from among the plurality of pixels.

18. A manufacturing method of a display device, comprising:
transferring a plurality of light emitting elements grown on a growth substrate onto a first film to be spaced from one another by a first distance;
expanding the first film by using an expanding device to space each of the plurality of light emitting elements on the first film from adjacent light emitting elements by a second distance larger than the first distance;
retransferring the light emitting elements that are spaced from one another by the second distance on the first film to a second film;
determining positions of the light emitting elements on the second film by irradiating a guide laser beam;
removing an ineffective light source from among the light emitting elements on the second film, and binning the light emitting elements;
forming a plurality of pixels on a substrate, each of the pixels comprising one or more of transistors, a first electrode electrically connected to a transistor from among the one or more transistors, and a bonding electrode on the first electrode;
transferring each of the light emitting elements on the second film to a corresponding bonding electrode of a corresponding pixel from among the plurality of pixels by irradiating a laser beam by using a laser shot;
bonding each of the transferred light emitting elements to the corresponding bonding electrode of the corresponding pixel; and
forming a second electrode on each of the transferred light emitting elements.

19. The manufacturing method of claim 18, wherein the second distance is 10 μm or more, and is larger than a size of the laser shot.

20. The manufacturing method of claim 19, wherein the first film is expanded so that a density of the plurality of light emitting elements corresponds to that of the bonding electrodes of the plurality of pixels.

\* \* \* \* \*